United States Patent
Zhou et al.

(10) Patent No.: US 12,119,340 B2
(45) Date of Patent: Oct. 15, 2024

(54) SEMICONDUCTOR CIRCUIT INCLUDING A TIE-LOW CIRCUIT AND METHOD OF FABRICATING SAME

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Kai Zhou, Hsinchu (TW); Yaqi Ma, Hsinchu (TW); Wei Li, Hsinchu (TW); Yongliang Jin, Hsinchu (TW); CunCun Chen, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 276 days.

(21) Appl. No.: 17/452,316

(22) Filed: Oct. 26, 2021

(65) Prior Publication Data

US 2023/0092315 A1    Mar. 23, 2023

(30) Foreign Application Priority Data

Sep. 14, 2021    (CN) .......................... 202111072832.0

(51) Int. Cl.
| | |
|---|---|
| H01L 27/02 | (2006.01) |
| G06F 30/392 | (2020.01) |
| H01L 21/8238 | (2006.01) |
| H01L 23/528 | (2006.01) |
| H01L 27/092 | (2006.01) |

(52) U.S. Cl.
CPC ........ *H01L 27/0251* (2013.01); *G06F 30/392* (2020.01); *H01L 21/8238* (2013.01); *H01L 23/5286* (2013.01); *H01L 27/092* (2013.01)

(58) Field of Classification Search
CPC ............... H01L 27/0251; H01L 27/092; H01L 21/8238; H01L 23/5286; H01L 23/60; H01L 27/0248; G06F 30/392; H02H 3/22; H02H 9/046; H05K 1/0259
See application file for complete search history.

(56) References Cited

U.S. PATENT DOCUMENTS

| | | | | |
|---|---|---|---|---|
| 5,898,341 | A  * | 4/1999 | Miyashita | H03F 3/4565 |
| | | | | 330/261 |
| 7,221,183 | B2 * | 5/2007 | Chen | H03K 3/356182 |
| | | | | 326/82 |
| 7,260,442 | B2 | 8/2007 | Hwang et al. | |
| 8,766,958 | B2 * | 7/2014 | Zhang | G09G 3/3677 |
| | | | | 345/204 |

(Continued)

*Primary Examiner* — Jeffrey A Gblende
(74) *Attorney, Agent, or Firm* — Hauptman Ham, LLP

(57) ABSTRACT

A circuit (to shape a follower voltage for a follower circuit) includes a tie-low circuit and an anti-noise circuit. The tie-low circuit is connected between a follower node and a first reference voltage. The tie-low circuit is responsive to a second reference voltage. The follower node is connectable to the follower circuit. The anti-noise circuit is connected between the follower node and the second reference voltage. The anti-noise circuit is configured to protect the follower voltage at the follower node from otherwise being distorted by a noise voltage being coupled capacitively to the follower node.

20 Claims, 23 Drawing Sheets

(56) References Cited

U.S. PATENT DOCUMENTS

| | | |
|---|---|---|
| 9,256,709 B2 | 2/2016 | Yu et al. |
| 2008/0280578 A1 | 11/2008 | Nimura |
| 2014/0040838 A1 | 2/2014 | Liu et al. |
| 2014/0085560 A1* | 3/2014 | Sung .................... G09G 3/3677 |
| | | 349/43 |
| 2015/0278429 A1 | 10/2015 | Chang |
| 2021/0313314 A1* | 10/2021 | Lin ........................ H02H 9/046 |

\* cited by examiner

SEMICONDUCTOR CIRCUIT INCLUDING A TIE-LOW CIRCUIT AND METHOD OF FABRICATING SAME

BACKGROUND

Tie-low circuits are used to connect standard cells to ground rather than having a standard cell directly connected to ground. Tie-low circuits thereby are used for electrostatic discharge protection. Tie-low circuits are often operated by a gated power supply voltage that activates and deactivates the tie-low circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
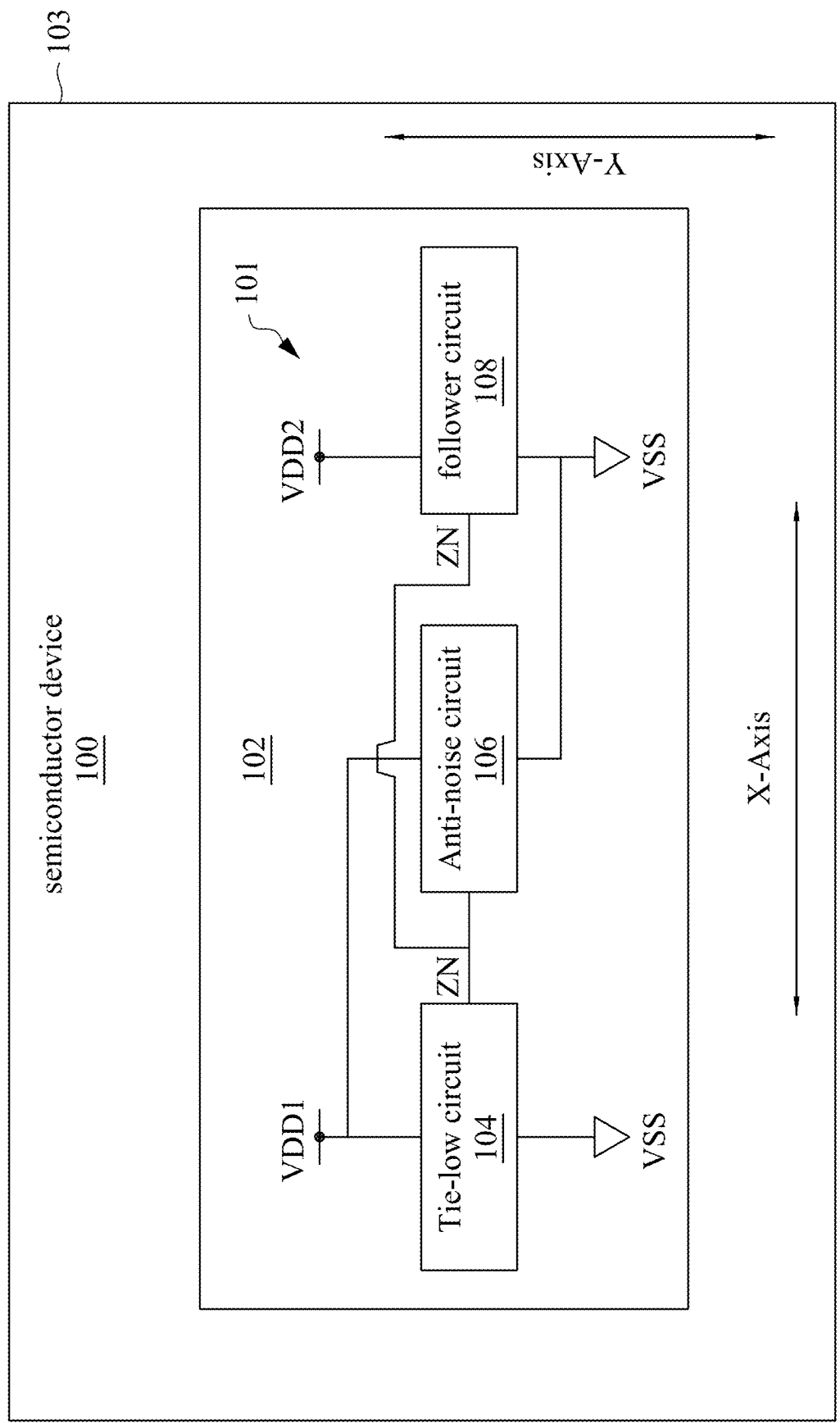
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor circuit includes a tie-low circuit to selectively pull down a voltage at a follower node toward a reference voltage, the follower node being connected to a follower circuit. In some embodiments, the tie-low circuit and the follower circuit operate in different voltage domains. Each voltage domain correspondingly has a different power supply voltage. When the tie-low circuit is turned on, the tie-low circuit pulls the voltage at the follower node toward the reference voltage. However, when the tie-low circuit is turned off, the tie-low circuit does not pull down the voltage at the follower node toward ground. In some embodiments in which the tie-low circuit does not pull the voltage at the follower node down toward the reference when the tie-low circuit is turned off, the follower node is left floating. The tic-low circuit is turned on and off by a first gated power supply voltage within a first voltage domain corresponding to the tie-low circuit. The follower circuit is provided with a second gated power supply voltage within a second voltage domain corresponding to the follower circuit, the first gated power supply being different than the second gated power supply voltage. In some circumstances, the level of the first gated power supply voltage is below the threshold level of the tie-low circuit which turns off, i.e., deactivates, the tie-low circuit while the level of the second gated power supply voltage provided to the follower circuit is at or near a maximum value of the second gated voltage. In these circumstances, the second gated power supply voltage represents a parasitic noise voltage with respect to the follower node. To reduce effects of the parasitic noise voltage at the follower node during these circumstances, an anti-noise circuit is included to offset, e.g., discharge, the parasitic noise voltage at the follower node.

FIG. 1 is a block diagram of a semiconductor device 100, in accordance with some embodiments.

In FIG. 1, semiconductor device 100 includes, among other things, a cell region 102. Cell region 102 is located in and on a semiconductor substrate 103. Cell region 102 has a circuit 101 that includes a tie-low circuit 104, an anti-noise circuit 106, and a follower circuit 108. In some embodiments, tie-low circuit 104 and anti-noise circuit 106 are provided in a first cell region and follower circuit 108 is provided in a second cell region. In some embodiments, each of tie-low circuit 104, anti-noise circuit 106 and follower circuit 108 are provided in a separate corresponding cell region.

Tie-low circuit 104 is connected between a follower node ZN and a reference voltage VSS. Reference voltage VSS is a ground voltage (i.e., ≈0V). In other embodiments, reference voltage VSS (also referred to as ground voltage VSS) has a positive voltage level above 0V or a negative voltage level below 0V. Tie-low circuit 104 is responsive to a reference voltage VDD1. Reference voltage VDD1 (also referred to as power supply voltage VDD1) is a power supply voltage. Power supply voltage VDD1 is configured to have a first state and a second state. In some embodiments, when power supply voltage VDD1 is in the first state, power supply voltage VDD1 is set at a first DC voltage level which is positive. In some embodiments, when power supply voltage VDD1 is in the second state, power supply voltage VDD1 is set at or near the ground voltage.

In FIG. 1, tie-low circuit 104 is configured to be responsive to power supply voltage VDD1. In some embodiments, tie-low circuit 104 is configured to pull down a follower voltage at follower node ZN toward reference voltage VSS (e.g., the ground voltage) in response to power supply voltage VDD1 being in the first state. In some embodiments, tie-low circuit 104 is configured to not pull down the follower voltage at follower node ZN toward the reference voltage VSS in response to power supply voltage VDD1 being in the second state. In some embodiments, in given circumstances in which power supply voltage VDD1 is in the second state and consequently the tie-low circuit is turned off, i.e., the tie-low circuit does not pull the voltage at the follower node down toward reference voltage VSS, the follower voltage at follower node ZN is left floating. In the given circumstances, the second gated power supply voltage represents a parasitic noise voltage with respect to the follower node. The follower voltage at follower node ZN is thus susceptible to noise while power supply voltage VDD1 is in the second state because the follower voltage at follower node ZN is not being actively pulled toward a particular voltage.

Follower node ZN is connectable to a follower circuit 108. In some embodiments, follower node ZN is connectable to more than one follower circuit, like the follower circuit 108. Follower circuit 108 is configured to operate based on the voltage state at follower node ZN. In some embodiments, follower circuit 108 is configured to turn off if the follower voltage at follower node ZN is above a threshold voltage level of the follower circuit. Thus, to prevent the follower circuit from being turned off unintentionally, the follower voltage at follower node ZN is protected from being pulled up by the parasitic noise voltage in the given circumstances in which power supply voltage VDD1 is in the second state and consequently the tie-low circuit is turned off, i.e., the tie-low circuit does not pull the voltage at the follower node down toward reference voltage VSS.

However, follower circuit 108 is configured to receive a reference voltage VDD2. Reference voltage VDD2 (also, referred to as power supply voltage VDD2) is a power supply voltage in the power domain corresponding to follower circuit 108. Accordingly, in FIG. 1, follower node ZN is coupled not only to follower circuit 108 and tie-low circuit 104, but also to anti-noise circuit 106. Power supply voltage VDD2 is configured to be in a first state and a second state. When power supply voltage VDD2 is in the first state, power supply voltage VDD2 is at or near a second DC voltage level which is positive. In some embodiments, when power supply voltage VDD2 is in the second state, power supply voltage VDD2 is at or near the ground voltage.

In some embodiments, the second DC voltage level is different than the first DC voltage level. In some embodiments, power supply voltage VDD1 is a core voltage and power supply voltage VDD2 is an input/output (IO) supply voltage. The IO supply voltage is used to power IO devices in analog circuits while the core voltage is used to power core devices in digital circuits. Core devices have relatively thin gate oxide layers and are referred to as thin gate oxide devices, thin gate devices or thin oxide devices. By contrast, IO devices have relatively thick gate oxide layers and are referred to as thick gate oxide devices, thick gate devices or thick oxide devices. Example thicknesses for thin gate oxides and thick gate oxides vary according to the corresponding semiconductor process technology node. In some embodiments, thin gate oxides have a thickness t_thin in a range (≈1.4 nm)≤t_thin≤(≈4 nm), and thick gate oxides have a thickness t_thick in a range (≈6 nm)≤t_thick≤(≈30 nm). Accordingly, the power supply voltage level of the IO supply voltage is higher than the power supply voltage level of the core voltage.

In some embodiments in which power supply voltage VDD1 is the core voltage and power supply voltage VDD2 is the IO supply voltage, the first DC voltage level of power supply voltage VDD1 is less than the second DC voltage level of the power supply voltage VDD2. In other embodiments in which power supply voltage VDD1 is the IO voltage and power supply voltage VDD2 is the core voltage, the first DC voltage level of power supply voltage VDD1 is greater than the second DC voltage level of the power supply voltage VDD2.

In some embodiments, power supply voltage VDD2 is in the first state while power supply voltage VDD1 is in the second state. Thus, power supply voltage VDD2 is being supplied at or near the second DC voltage level while follower voltage at the follower node ZN is not being pulled down towards reference voltage VSS (e.g., follower voltage is floating). Additionally, follower node ZN is parasitically capacitively coupled to power supply voltage VDD2. Without correction, the parasitic capacitive coupling causes the follower voltage on follower node ZN to be distorted by a parasitic noise voltage caused by power supply voltage VDD2. If left uncorrected, the parasitic noise voltage causes the follower voltage at follower node ZN to rise above the threshold voltage level of the follower circuit 108 thereby causing follower circuit 108 to turn off, i.e., to operate incorrectly.

Accordingly, anti-noise circuit 106 is connected to follower node ZN so as to offset the parasitic noise voltage induced by reference voltage VDD2. Anti-noise circuit 106 is configured to protect the follower voltage at follower node ZN from otherwise being distorted by the parasitic noise voltage being coupled capacitively to follower node ZN. In some embodiments, anti-noise circuit 106 is configured to discharge follower node ZN in order to neutralize the noise voltage. In some embodiments, anti-noise circuit 106 is configured to offset the noise voltage at follower node ZN.

Figure 2A:
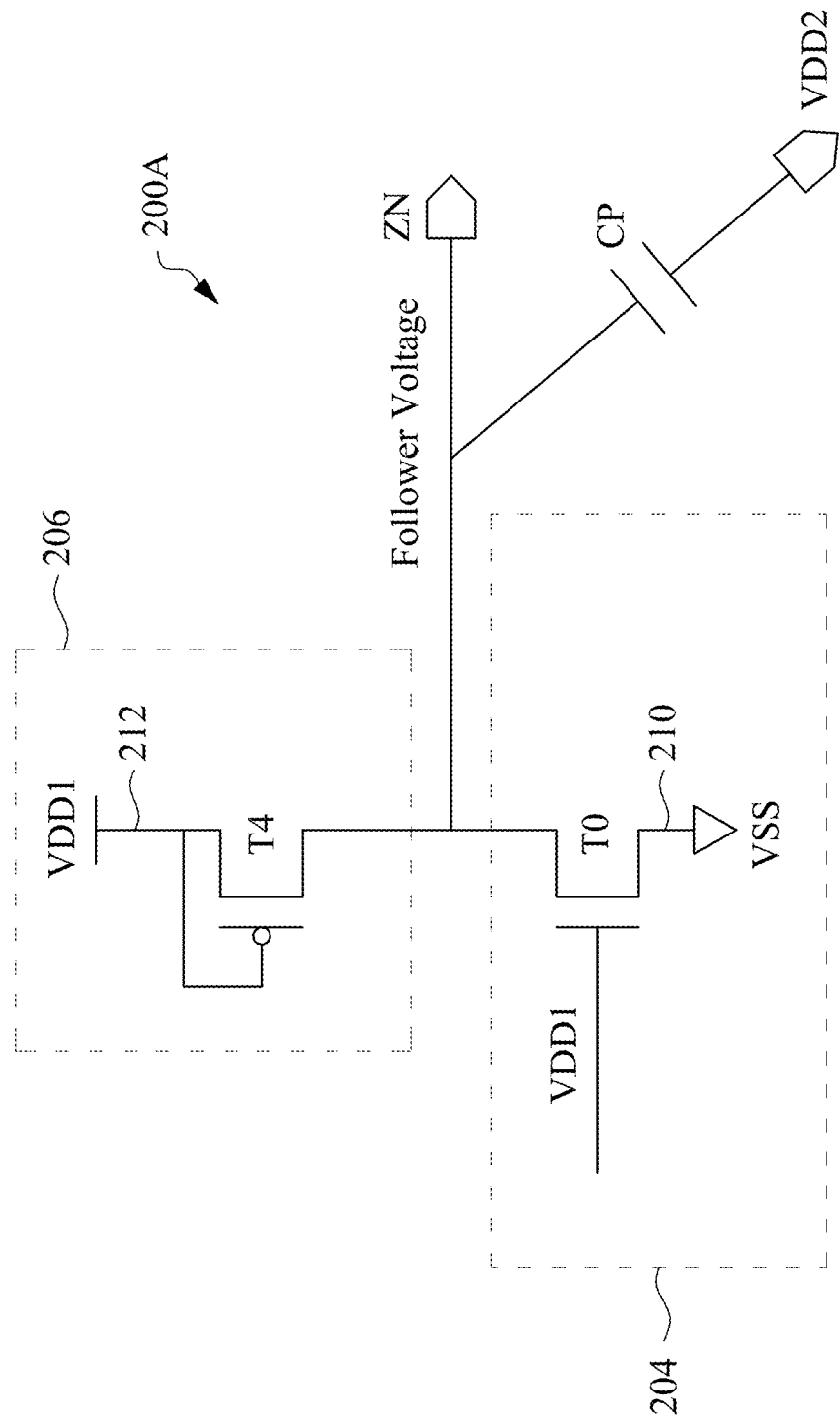
FIG. 2A is a circuit diagram of a circuit, in accordance with some embodiments.

FIG. 2A is a circuit diagram of a circuit 200A, in accordance with some embodiments.

Circuit 200A includes a tie-low circuit 204 and an anti-noise circuit 206. Tie-low circuit 204 is an example of tie-low circuit 104 in FIG. 1. Anti-noise circuit 206 is one example of anti-noise circuit 106 in FIG. 1.

In FIG. 2A, tie-low circuit 204 includes a N-channel Field Effect Transistor (NFET) T0. NFET T0 has a gate that is configured to receive power supply voltage VDD1, a drain that is connected to follower node ZN, and a source that is connected to a reference terminal 210. Reference terminal 210 is configured to receive reference voltage VSS.

Accordingly, NFET T0 is configured to pull down the follower voltage at follower node ZN toward the reference voltage VSS in response to power supply voltage VDD1 being in the first state (e.g., being at or near the first DC supply voltage level). However, when power supply voltage VDD1 is set to the second state (e.g., set at or near the ground voltage), NFET T0 is turned off. Thus, NFET T0 is configured to adjust the follower voltage at follower node ZN such that the follower voltage at follower node ZN is not being pulled down towards the reference voltage VSS in response to power supply voltage VDD1 being in the second state. In some embodiments, the follower voltage at the follower node ZN is floating in response to power supply voltage VDD1 being in the second state.

As shown in FIG. 2A, follower node ZN is parasitically capacitively coupled to power supply voltage VDD2 by a parasitic capacitance represented by capacitance CP. Thus, regarding given circumstances in which power supply voltage VDD2 is in the first state (e.g., is at or near the second DC voltage level) and power supply voltage VDD1 is in the second state (e.g., is at or near ground) NFET T0 is turned off, and so NFET T0 does not pull down the follower voltage at follower node ZN which otherwise would offset the parasitic noise voltage at follower node attributed to power supply voltage VDD2. Anti-noise circuit 206 is provided to fortify follower node ZN against the parasitic noise voltage, e.g., in the given circumstances.

Anti-noise circuit 206 is connected between follower node ZN and the power supply voltage VDD1. Anti-noise circuit 206 is configured to protect the follower voltage at the follower node ZN from otherwise being distorted by the parasitic noise voltage which is coupled capacitively to follower node ZN. In FIG. 2A, anti-noise circuit 206 includes a diode-connected FET T4. In FIG. 2A, diode-connected FET T4 is a P-channel FET (PFET). Diode-connected FET T4 has a first drain/source terminal connected to a power source node 212, a second drain/source terminal connected to follower node ZN, and a gate terminal connected to the first drain/source terminal and power source node 212. Power source node 212 is configured to receive power source voltage VDD1. The diode configuration of PFET T4 represents a diode for which the cathode is connected to VDD1 and the anode is connected to follower node ZN.

In FIG. 2A, when power supply voltage VDD1 is in the first state (e.g., at or near the first DC voltage level), the first drain/source terminal of diode-connected FET T4 operates as the source of diode-connected FET T4 and the second drain/source terminal of diode-connected FET T4 (which is connected to follower node ZN and thus is being pulled towards reference voltage VSS) operates as the drain of diode-connected FET T4. Accordingly, diode-connected FET T4 is reverse-biased albeit not to a level that reaches a breakdown-voltage of diode-connected FET T4. When diode-connected FET T4 is reverse-biased, diode-connected FET T4 does not conduct and so diode-connected FET T4 does not pull up the follower voltage on follower node ZN toward power supply voltage VDD1, which otherwise would offset effects of PFET TO pulling down the follower voltage on follower node ZN toward VSS.

When power supply voltage VDD1 is in the second state (e.g., at or near ground)), the first drain/source terminal of diode-connected FET T4 operates as the drain of diode-connected FET T4 and the second drain/source terminal of diode-connected FET T4 (which is connected to follower node ZN and thus is not being pulled towards reference voltage VSS) operates as the source of diode-connected FET T4. This is because power supply voltage VDD2 is in the first state (e.g., at or near the second DC voltage level) and thus the parasitic noise voltage presents the high voltage at follower node ZN, i.e., VDD1<VDD2. Accordingly, diode-connected FET T4 is forward-biased and so diode-connected FET T4 conducts, which pulls down the follower voltage (i.e., the parasitic noise voltage VDD2) toward VDD1 with a result that the parasitic noise voltage is discharged through the diode-connected FET T4.

Figure 2B:
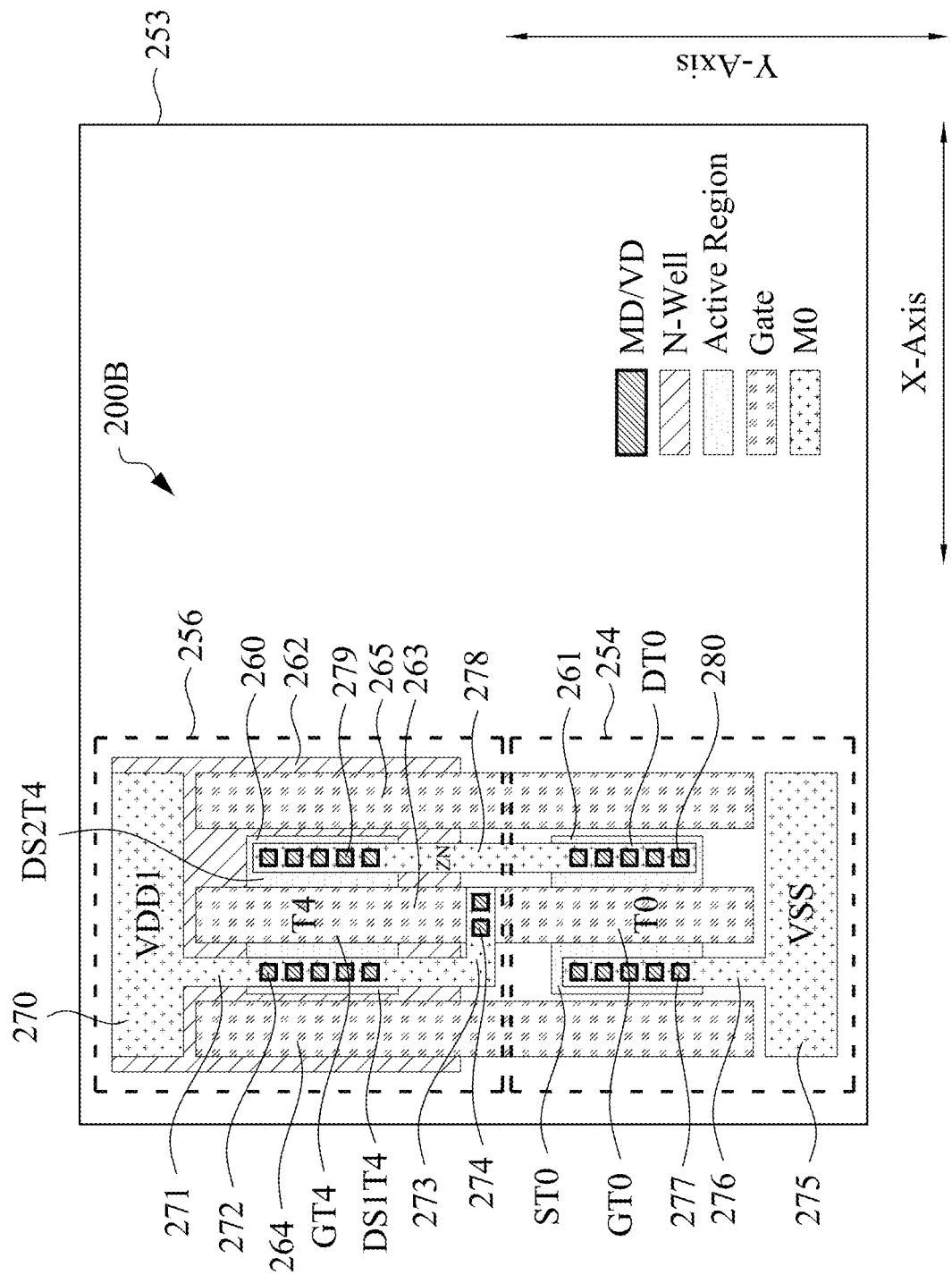
FIG. 2B is a layout diagram of a semiconductor circuit, in accordance with some embodiments.

FIG. 2B is a layout diagram 200B of a semiconductor circuit, in accordance with some embodiments.

Layout diagram 200B represents structures in a semiconductor circuit that is an example of the circuit 200A shown in FIG. 2A. The semiconductor circuit shown in FIG. 2B is also an example of circuit 101 in FIG. 1. The structures in the semiconductor device are represented by shapes (also known as patterns) in the layout diagram. For simplicity of discussion, elements in the layout diagram of FIG. 2B (and of other figures included herein) will be referred to as if they are structures rather than patterns per se. For example, shape 260 represents an active region (also referred to as an oxide-dimensioned (OD) region). In the following discussion, element 260 is referred to as active region 260 rather than active-region shape 260.

Layout diagram 200B includes a tie-low circuit 254 and an anti-noise circuit 256. Layout diagram 200B includes a representation of a semiconductor substrate 253. Semiconductor substrate 253 is an example of semiconductor substrate 103 in FIG. 1. Semiconductor substrate 253 is formed from, in at least one embodiment, silicon, silicon germanium (SiGe), gallium arsenic, or other suitable semiconductor materials.

Semiconductor substrate 253 includes an active region 260 and an active region 261. Active region 260 is doped so as to have P-type conductivity while active region 261 is doped so as to have N-type conductivity. Active region 260 is located in an N-well 262 that has been included within semiconductor substrate 253. Active region 260 and active region 261 each have a long axis that extends in a first direction (parallel to the X-axis) and a short axis that extends in a second direction (parallel to the Y-axis). The second direction is perpendicular to the first direction. Active region 260 and active region 261 are separated with respect to the Y-axis.

A gate electrode 263 is formed on and over active region 260 and active region 261. Gate electrode 263 has a long axis that is parallel to the Y-axis. In some embodiments, gate electrode 263 is formed in a polysilicon (Poly) layer. Gate electrode 264 is located to the left of gate electrode 263 and formed in the Poly layer. Gate electrode 264 has a long axis that extends parallel to the Y-axis. In this example, gate electrode 264 is a dummy electrode and is not used to form a field effect transistor (FET). Gate electrode 265 is located to the right of gate electrode 263 and formed in Poly layer. Gate electrode 265 has a long axis that extends parallel to the Y-axis. In this example, gate electrode 265 is a dummy electrode and is not used to form a FET. Gate electrodes 263, 264, 265 are separated with respect to the X-axis.

An example of NFET T0 (which was discussed above with respect to FIG. 2A) is located in tie-low circuit 254. Active region 261 and a portion of gate electrode 263 form NFET T0. The portion of gate electrode 263 on and over active region 261 is a gate GT0 of NFET T0. The portion of active region 261 to the left of gate GT0 is a source ST0 of NFET T0 and portion of active region 261 to the right of gate GT0 is a drain DT0 of NFET T0.

An example of PFET T4 (which was discussed above with respect to FIG. 2A) is located in anti-noise circuit 256. Active region 260 and a portion of gate electrode 263 form PFET T4. The portion of gate electrode 263 on and over active region 260 is a gate GT4 of PFET T4. The portion of active region 260 to the left of gate GT4 is a first drain/source DS1T4 of PFET T4 and portion of active region 260 to the right of gate GT4 is a second drain/source DS2T4 of PFET T4. When power supply voltage VDD1 is in the first state, first drain/source DS1T4 is the source of PFET T4 and second drain/source DS2T4 is the drain of PFET T4. When power supply voltage VDD1 is in the second state, first drain/source DS1T4 is the drain of PFET T4 and second drain/source DS2T4 is the source of PFET T4.

A conductor 270 has a long axis that extends parallel to the X-axis. Conductor 270 is above active region 260 and gate electrodes 263, 264, 265 relative to the Y-axis. Conductor 270 is configured to receive power supply voltage VDD1. Conductor 270 corresponds to power source node 212 in FIG. 2A. A conductor 271 is connected to conductor 270 and has a long axis that extends parallel to the Y-axis. Conductor 271 extends over first drain/source DS1T4. Vias 272 (only one is labeled for the sake of clarity) connect conductor 271 to first drain/source DS1T4.

A conductor 273 is connected to conductor 271 and has a long axis that extends parallel to the X-axis. Conductor 273 extends over gate electrode 263. Vias 274 (only one is labeled for the sake of clarity) connect conductor 273 to gate electrode 263.

A conductor 275 has a long axis that extends parallel to the X-axis. Conductor 275 is below active region 261 and gate electrodes 263, 264, 265 relative to the Y-axis. Conductor 275 is configured to receive reference voltage VSS. Conductor 275 corresponds to ground node 210 in FIG. 2A. A conductor 276 is connected to conductor 275 and has a long axis that extends parallel to the Y-axis. Conductor 276 extends over source ST0. Vias 277 (only one is labeled for the sake of clarity) connect conductor 276 to source ST0.

A conductor 278 has a long axis that extends parallel to the Y-axis. Conductor 278 extends over the second drain/source DS2T4 and over the drain DT0. Conductor 278 corresponds with follower node ZN in FIG. 2A. Vias 279 (only one is labeled for the sake of clarity) connect conductor 278 to drain/source DS2T4. Vias 280 (only one is labeled for the sake of clarity) connect conductor 278 to drain DT0.

Terminal contacts for first drain/source DS1T4, the second drain/source DS1T4, source ST0, and drain DT0 DS1T4 are formed in a metal-to-device (MD) layer that is over the substrate with respect to a third direction (parallel to the Z-axis, which is not shown in FIG. 2B but goes into and out of the page). The third direction is perpendicular to both the first direction and the second direction. Vias 272, 274, 277, 279, 280 are provided in a via-to-device (VD) layer. The MD layer and VD layer are collectively referred to as MD/VD layer. Conductors 270, 271, 273, 275, 276, 278 are located in a metal layer M0. Metal layer M0 is the first metal layer that is above MD/VD layer with respect to the Z-axis. Active regions 260, 261 are formed as oxide-definition (OD) regions within semiconductor substrate 253. The layout diagrams disclosed herein assume a corresponding semiconductor process technology node which includes various design rules for generating a layout diagram, and further assume that the design rules follow a numbering convention in which a first level of metallization (M_1st) and a corresponding first level of interconnect structures (V_1st) are referred to correspondingly as M0 and V0. In some embodiments, the numbering convention assumes that the M_1st level and the V_1st level are referred to correspondingly as M1 and V1.

In other embodiments, conductors 270, 271, 273, 275, 276, 278 are formed in other metal layers (e.g., metal layer M1, metal layer M2, metal layer M3, etc.) and conductive components in via layers and metal layers underneath conductors 270, 271, 273, 275, 276, 278 connect conductors 270, 271, 273, 275, 276, 278 to the appropriate features in layout diagram 200B.

Figure 3A:
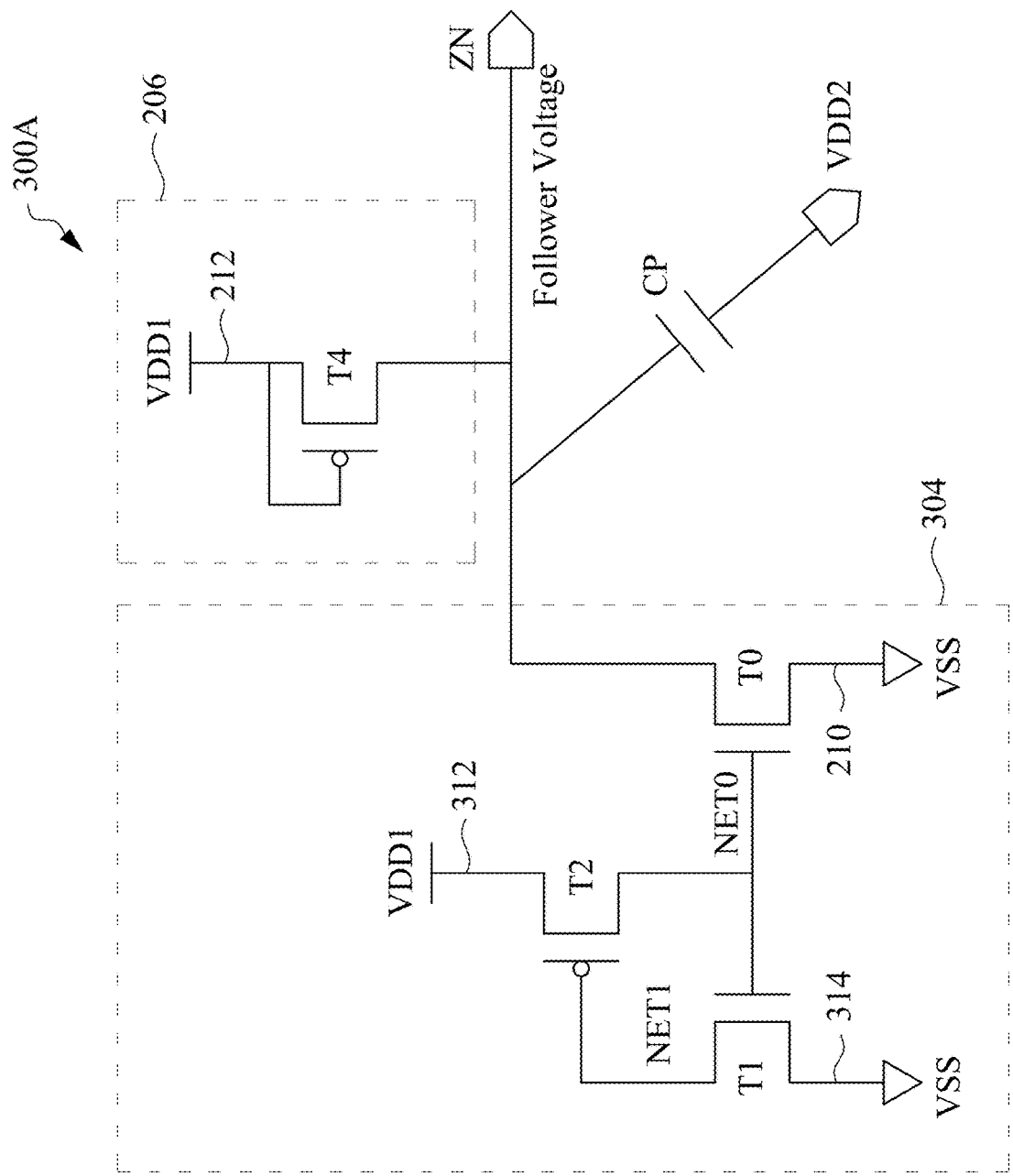
FIG. 3A is a circuit diagram of a circuit, in accordance with some embodiments.

FIG. 3A is a circuit diagram of a circuit 300A, in accordance with some embodiments.

Circuit 300A includes a tie-low circuit 304 and anti-noise circuit 206. Tie-low circuit 304 is an example of tie-low circuit 104 in FIG. 1. Anti-noise circuit 206 is described above with respect to FIG. 2A and is one example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Tie-low circuit 304 also includes NFET T0, which has the drain connected to follower node ZN and the source connected to ground node 210. However, in this embodiment, tie-low circuit 304 further includes NFET T1 and PFET T2. NFET T1 and PFET T2 are configured to provide a feedback effect that ensures that NFET T0 remains on in response to power supply voltage VDD1 being in the first state (e.g., at the first DC voltage level).

In FIG. 3A, the gate of NFET T0 is connected to an intermediary node NET0. A source of PFET T2 is connected to a power supply node 312. Power supply node 312 is configured to receive power supply voltage VDD1. A drain of the PFET T2 is connected to power supply node 312. A gate of PFET T2 is connected to an intermediary node NET1.

A gate of NFET T1 is connected to intermediary node NET0 and is thus connected to the drain of PFET T2 and the gate of NFET T0. A source of NFET T1 is connected to a reference node 314. Reference node 314 is configured to receive reference voltage VSS. A drain of NFET T1 is connected to intermediary node NET1. Thus, drain of NFET T1 is connected to gate of PFET T2.

Accordingly, when power supply voltage VDD1 is in the first state, PFET T2 is configured to pull intermediary node NET0 towards power supply voltage VDD1. In response, NFET T1 is turned on and thus pulls down intermediary node NET1 towards reference voltage VSS. In response, PFET T2 is turned on so that intermediary node NET0 is pulled towards power supply voltage VDD1. Accordingly, the pulling up of intermediary node NET0 by PFET T2 is reinforced by the pulling down of intermediary node NET1 by NFET T1 and vice versa. This feedback effect ensures that NFET T0 remains on in response to power supply voltage VDD1 being adjusted to the first state.

Both PFET T2 and NFET T1 are turned off in response to power supply voltage VDD1 being in the second state. Accordingly, NFET T0 is turned off in response to power supply voltage VDD1 being in the second state.

Figure 3B:
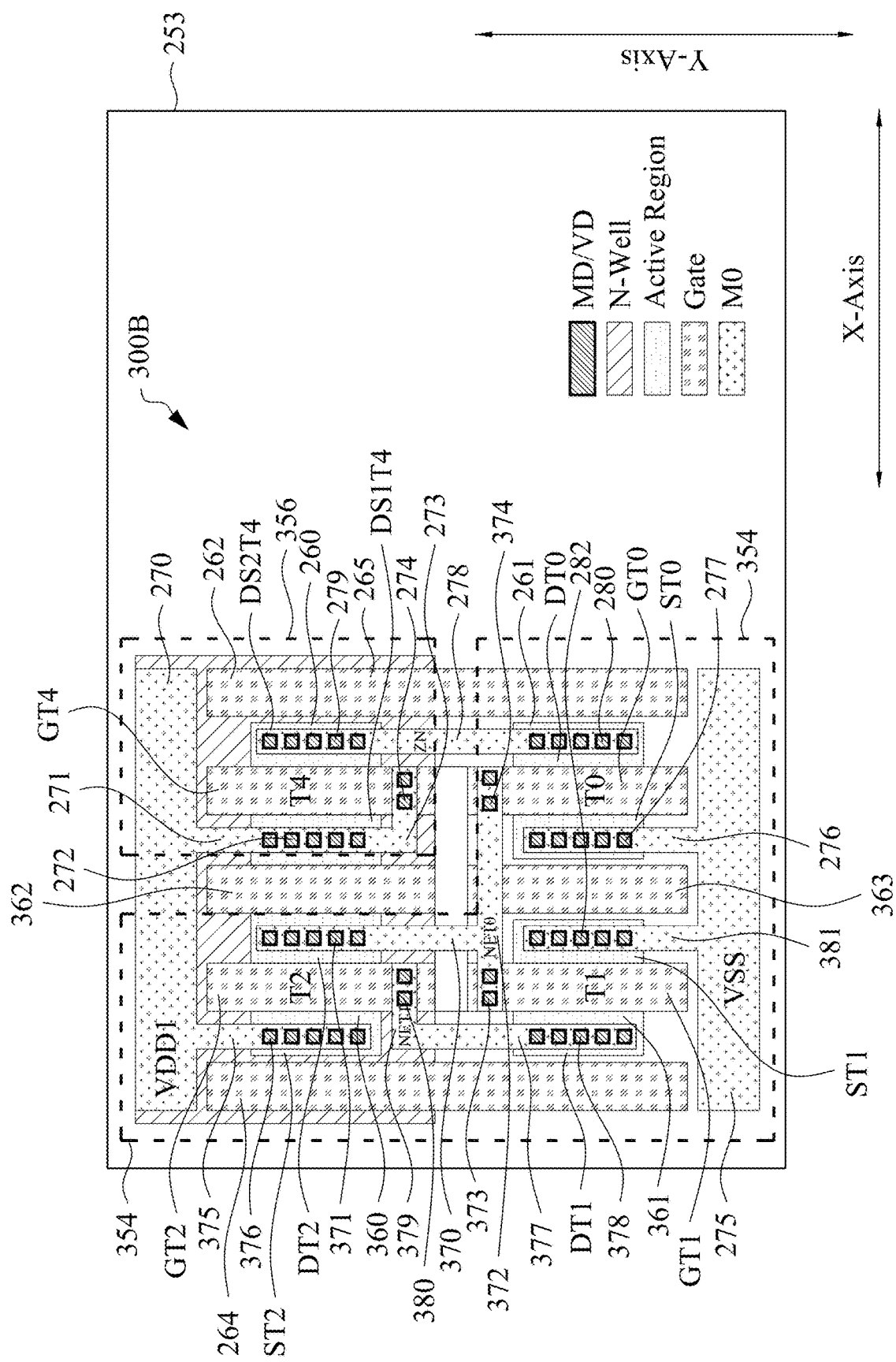
FIG. 3B is a layout diagram of a semiconductor circuit, in accordance with some embodiments.

FIG. 3B is a layout diagram 300B of a semiconductor circuit, in accordance with some embodiments.

The structures in the semiconductor device are represented by shapes (also known as patterns) in the layout diagram. For simplicity of discussion, elements in the layout diagram of FIG. 3B (and of other figures included herein) will be referred to as if they are structures rather than patterns per se. Layout diagram 300B represents a semiconductor circuit that is an example of the circuit 300A shown in FIG. 3A. The semiconductor circuit shown in FIG. 3B is also an example of circuit 101 in FIG. 1.

Layout diagram 300B includes a tie-low circuit 354. Layout diagram 300B also includes an anti-noise circuit 356 that is similar to the anti-noise circuit 256 described above with respect to FIG. 2B.

Layout diagram 300B includes one embodiment of semiconductor substrate 253. Semiconductor substrate 253 includes N-well 262, active region 260 and active region 261, as described above with respect to FIG. 2A. Layout diagram 300B also includes conductors 270, 271, 273, 275, 276, 278 and vias 272, 274, 277, 279, 280 as described above with respect to FIG. 2A, except that conductor 273 and vias 274 are only connected to gate GT4 and not to gate GT0. In FIG. 3B, gate GT4 and gate GT0 are provided by separated gate electrode in Poly layer. The gate electrode of gate GT4 extends on and over active region 260 and the gate electrode of gate GT0 extends on and over active region 261 but are separated. In FIG. 3B, conductor 273 and vias 274 are only connected to gate GT4.

In this embodiment, an active region 360 is located within N-well 262 and to the left of active region 260. An active region 361 is located to the left of active region 261. Active region 360 is doped so as to have P-type conductivity while active region 361 is doped so as to have N-type conductivity. Active region 360 and active region 361 each have a long axis that extends in a first direction (parallel to the X-axis) and a short axis that extends in a second direction (parallel to the Y-axis). The second direction is perpendicular to the first direction. Active region 360 and active region 361 are aligned with respect to the X-axis and separated with respect to the Y-axis.

A gate electrode 362 is formed on and over the N-well 262 between active region 260 and active region 360. In this example, gate electrode 362 is a dummy gate electrode. A gate electrode 363 is formed on and over semiconductor substrate 253 between active region 261 and active region 361. In this example, gate electrode 362 is a dummy gate electrode. A gate electrode 363 is formed on and over the N-well 262 between active region 261 and active region 361. In this example, gate electrode 363 is a dummy gate electrode.

A gate GT2 of PFET T2 (discussed above with respect to FIG. 3A) is formed by a gate electrode that has a long axis that is parallel to the Y-axis and is on and over active region 360. Gate GT2 is to the left of gate electrode 362. A gate GT1 of NFET T1 (discussed above with respect to FIG. 3A) is formed by a gate electrode that has a long axis that is parallel to the Y-axis and is on and over active region 262. Gate GT1 is to the left of gate electrode 363.

The portion of active region 360 to the right of gate GT2 is a drain DT2 of PFET T2. The portion of active region 360 to the left of gate GT2 is a source ST2 of PFET T2. The portion of active region 361 to the right of gate GT1 is the source ST1 of NFET T1. The portion of active region 361 to the left of gate GT1 is a drain DT1 of NFET T1. Active regions 360, 361 are OD regions in semiconductor substrate 253.

A conductor 370 has a long axis that extends parallel to the Y-axis. Conductor 270 extends over drain DT2 of PFET T2. Vias 371 (only one is labeled for the sake of clarity) connect drain DT2 to conductor 370. A conductor 372 has a long axis that extends parallel to X-axis. Conductor 372 extends over a top portion (above active regions 261, 361 relative to the Y-axis) of gate GT1, gate electrode 363, and gate GT0. Vias 373 (only one is labeled for the sake of clarity) connect conductor 372 to gate GT1 and vias 374 (only one is labeled for the sake of clarity) connect conductor 372 to gate GT0. Conductor 372 corresponds to intermediary node NET0 in FIG. 3A.

A conductor 375 has a long axis that extends parallel to the Y-axis. Conductor 375 is connected to conductor 270. Conductor 375 also extends over source ST2 of PFET T2. Vias 376 (only one is labeled for the sake of clarity) connects conductor 375 to source ST2. Conductor 375 corresponds to power supply node 312 in FIG. 3A.

A conductor 377 has a long axis that extends parallel to the Y-axis. Conductor 377 also extends over drain DT1 of NFET T1. Vias 378 (only one is labeled for the sake of clarity) connects conductor 377 to drain DT1. A conductor 379 has a long axis that extends parallel to the X-axis. Conductor 379 is connected to conductor 377 and extends over bottom portion (below active region 360) of gate GT2. Vias 380 (only one is labeled for the sake of clarity) connects conductor 379 to gate GT2. Conductor 377 and conductor 379 correspond to intermediary node NET1.

A conductor 381 has a long axis that extends parallel to the Y-axis. Conductor 381 is configured to receive the reference voltage VSS. Conductor 381 extends over source ST1 of NFET T1. Vias 382 (only one is labeled for the sake of clarity) connects conductor 381 to source ST1. Conductor 381 correspond to ground node 314 in FIG. 3A.

Conductors 370, 373, 375, 377, 379, 381 are each located in metal layer M0. Vias 371, 373, 374, 376, 378, 380, 382 are each located in MD/VD layer. In other embodiments, conductors 370, 373, 375, 377, 379, 381 are formed and in other metal layers (e.g., metal layer M1, metal layer M2, metal layer M3, etc.) and conductive components in via layers and metal layers underneath conductors 370, 373, 375, 377, 379, 381 connect conductors 370, 373, 375, 377, 379, 381 to the appropriate features in layout diagram 300B.

Figure 4A:
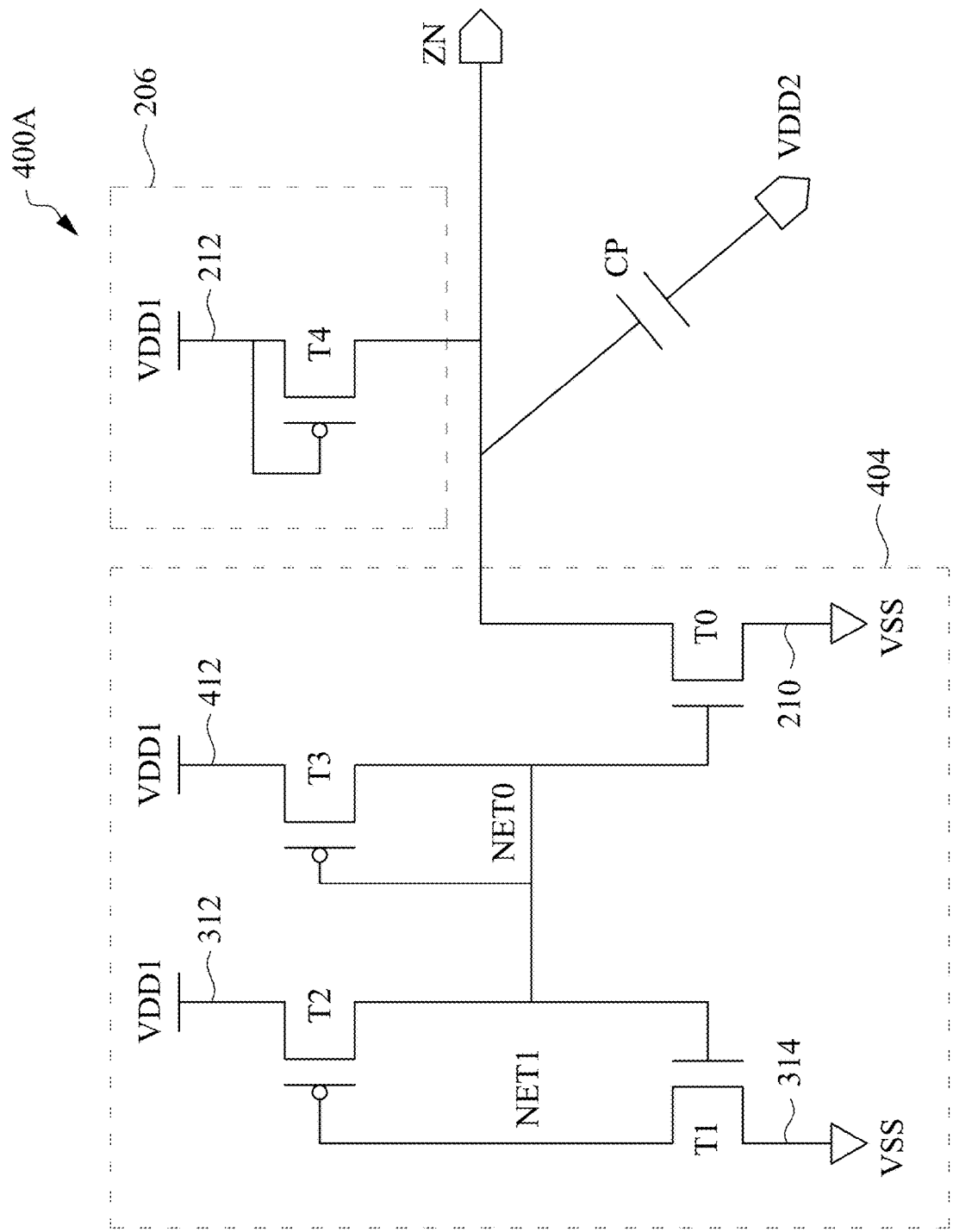
FIG. 4A is a circuit diagram of a circuit, in accordance with some embodiments.

FIG. 4A is a circuit diagram of a circuit 400A, in accordance with some embodiments.

Circuit 400A includes a tie-low circuit 404 and anti-noise circuit 206. Tie-low circuit 404 is an example of tie-low circuit 104 in FIG. 1. Anti-noise circuit 206 is described above with respect to FIG. 2A and is one example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Tie-low circuit 404 is similar to tie-low circuit 304 in FIG. 3A except that tie-low circuit 404 further includes PFET T3. PFET T3 helps pull up intermediary node NET0 when power supply voltage VDD1 is in the first state. PFET T3 has source connected to power supply node 412. Power supply node 412 is configured to receive power supply voltage VDD1. A drain and a gate of PFET T3 are both connected to intermediary node NET0. Accordingly, PFET T3 is connected in a diode-configuration. PFET T3 is configured to pull up intermediary node NET0 at or near power supply voltage VDD1 in response to power supply voltage VDD1 being in the first state.

Figure 4B:
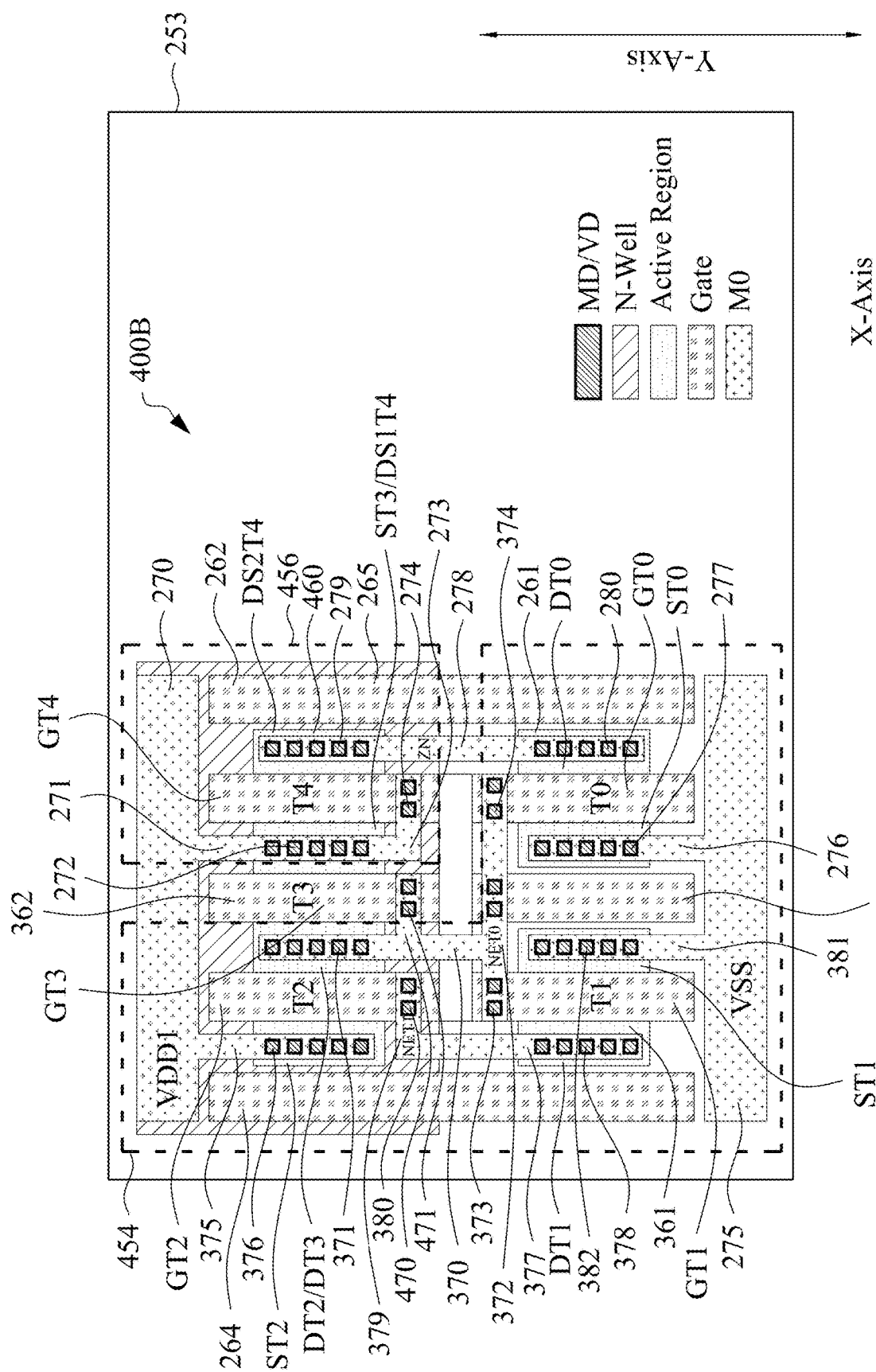
FIG. 4B is a layout diagram of a semiconductor circuit, in accordance with some embodiments.

FIG. 4B is a layout diagram 400B of a semiconductor circuit, in accordance with some embodiments.

The structures in the semiconductor device are represented by shapes (also known as patterns) in the layout diagram. For simplicity of discussion, elements in the layout diagram of FIG. 4B (and of other figures included herein) will be referred to as if they are structures rather than patterns per se. Layout diagram 400B represents a semiconductor circuit that is an example of the circuit 400A shown in FIG. 4A. The semiconductor circuit shown in FIG. 4B is also an example of circuit 101 in FIG. 1.

Layout diagram 400B includes an anti-noise circuit 456, which is similar to the anti-noise circuit 256 described above with respect to FIG. 2B. Layout diagram 400B also includes a tie-low circuit 454 that is similar to tie-low circuit 354 discussed above with respect to FIG. 3B, except that tie-low circuit 454 includes an example of PFET T3 (discussed above with respect to FIG. 4A) and PFET T2, PFET T3, and PFET T4 are all formed on active region 460 instead of separate active regions.

Active region 460 has a long axis that extends parallel to the X-axis and a short axis that extends parallel to the Y-axis. Unlike active regions 260, 360 in FIG. 2A, there is no separation in active region 460 so that active region 460 is an OD region that extends relative to the X-axis from near gate electrode 264 to near gate electrode 465. In this example, gate electrode 362 is a gate GT3 of PFET T3. Portion of active region 460 to the left of gate T2 is source ST2. Portion of active region 460 to the right of gate T2 and to the left of gate T3 is a drain DT2, DT3 of both PFET T2 and PFET T3. A portion of active region 460 is both a source ST3 of PFET T3 and a first drain/source DST1T4 of PFET T4. A portion of active region 460 to the right of gate T4 is the second drain/source region DS2T4 of PFET T4.

Additionally, in this embodiment, a conductor 470 has a long axis that extends parallel to the X-axis. Conductor 470 is connected to conductor 370. Conductor 470 extends over the portion of gate GT3 below active region 460. Vias 471 (only one is labeled for the sake of clarity) connect conductor 470 to gate GT3.

Conductor 470 is located in metal layer M0. Via 471 is located in MD/VD layer. In other embodiments, conductor 470 is formed and in other metal layers (e.g., metal layer M1, metal layer M2, metal layer M3, etc.) and conductive components in via layers and metal layers underneath conductor 470 connect conductor 470 to gate GT3.

Figure 4C:
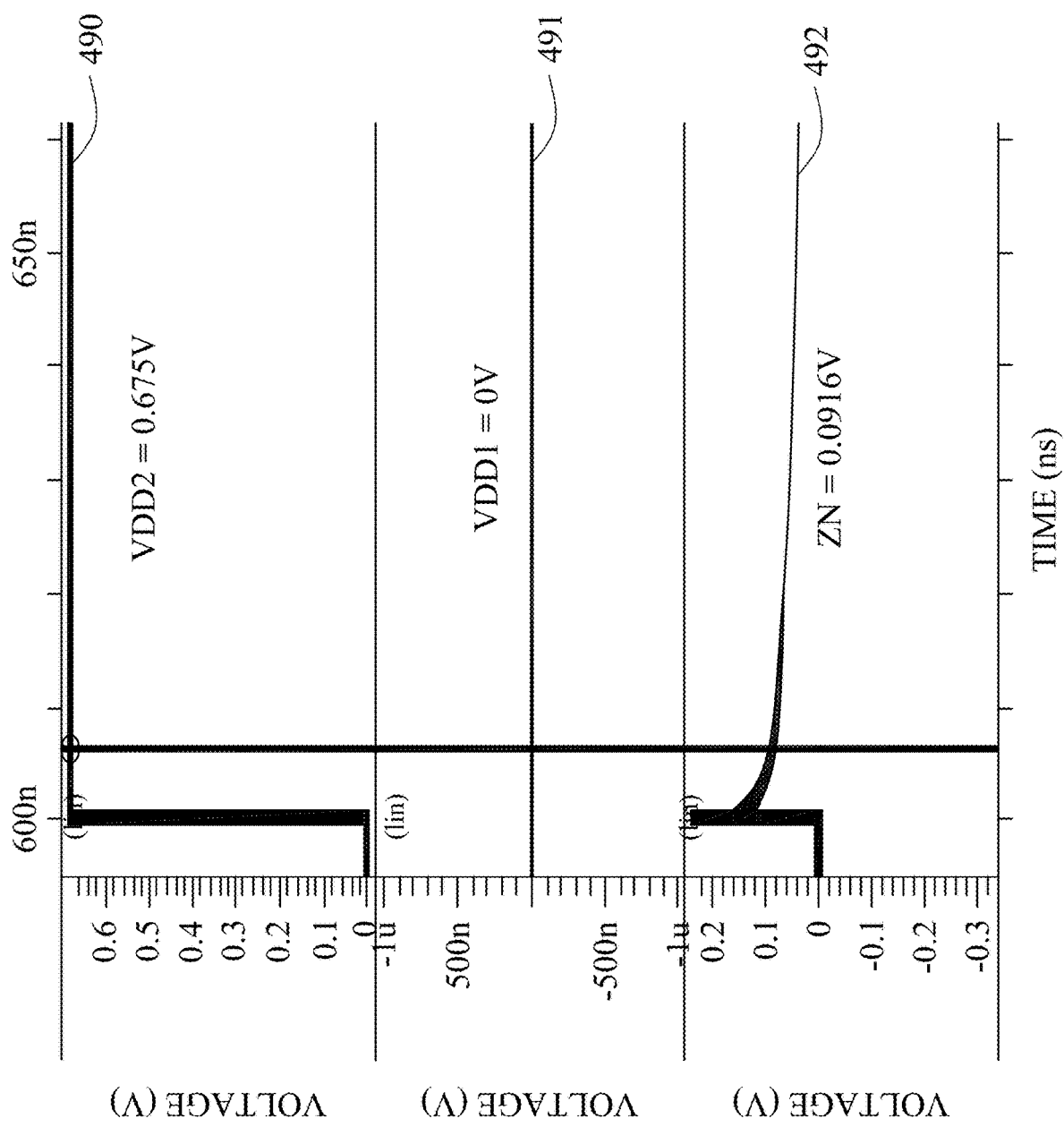
FIG. 4C is a diagram of voltage waveforms of power supply voltages and the follower voltage at follower node of the circuit shown in FIG. 4A.

FIG. 4C is a diagram of voltage waveforms illustrating power supply voltage VDD2, power supply voltage VDD1, and the follower voltage at follower node ZN of the circuit 400A shown in FIG. 4A.

The top voltage waveform has a voltage curve 490 representing power supply voltage VDD2, where the vertical axis of the top voltage diagram represents a voltage level of power supply voltage VDD2 and a horizontal axis of the top voltage diagram represents time The middle voltage waveform has a voltage curve 491 representing power supply voltage VDD1, where the vertical axis of the middle voltage waveform represents a voltage level of power supply voltage VDD1 and a horizontal axis of the middle voltage waveform represents time The bottom voltage waveform has a voltage curve 492 for the follower voltage at follower node ZN, where the vertical axis of the bottom voltage waveform represents a voltage level of the follower voltage and a horizontal axis of the bottom voltage waveform represents time.

As shown by voltage curve 491, power supply voltage VDD1 is in the second state (e.g., at or near 0V) during the entire time interval marked from ≈590 ns to ≈660 ns.

As shown by the voltage curve 490, power supply voltage VDD2 operates in the second state (e.g., at or near 0V) from a time interval marked from ≈590 ns to a time marked at ≈600 ns.

As shown by voltage curve 492, follower voltage is ≈0V from a time interval marked from ≈590 ns to a time marked at ≈600 ns.

At a time marked ≈600 ns, the voltage curve 490 shows that power supply voltage VDD2 is switched from the second state to the first state (e.g., at or near 0.675V). As shown by voltage curve 492, this results in a parasitic noise voltage being presented to the follower voltage at follower node ZN rising to ≈0.22V around time marked ≈600 ns.

As shown by voltage curve 490, power supply voltage VDD2 remains in the first state from the time interval marked from ≈600 ns to ≈660 ns.

As shown by voltage curve 492, anti-noise circuit 206 (See FIG. 4A) results in the parasitic noise voltage being discharged from ≈0.22V to ≈0.0916V during the time interval marked from ≈600 ns to ≈660 ns. Anti-noise circuit 206 thus reduces the effects of the parasitic noise voltage at follower node ZN while the power supply voltage VDD1 is in the second state and power supply voltage VDD2 is in the first state.

Figure 5A:
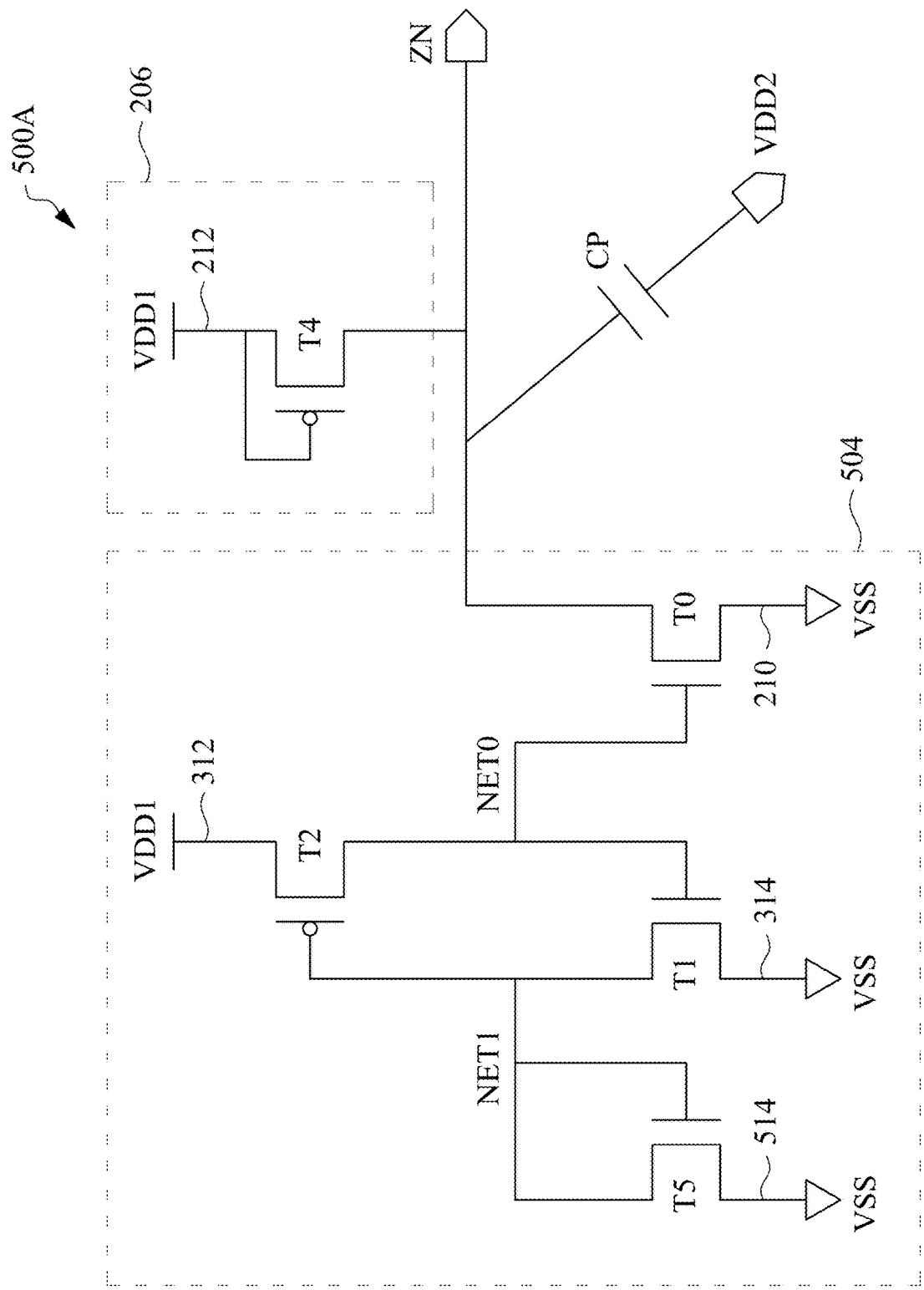
FIG. 5A is a circuit diagram of a circuit, in accordance with some embodiments.

FIG. 5A is a circuit diagram of a circuit 500A, in accordance with some embodiments.

Circuit 500A includes a tie-low circuit 504 and anti-noise circuit 206. Tie-low circuit 504 is an example of tie-low circuit 104 in FIG. 1. Anti-noise circuit 206 is described above with respect to FIG. 2A and is one example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Tie-low circuit 504 is similar to tie-low circuit 304 in FIG. 3A except that tie-low circuit 504 further includes NFET T5. NFET T5 helps pull down intermediary node NET1 to or near the reference voltage VSS when power supply voltage VDD1 is in the first state. NFET T5 has source connected to ground node 514. Ground node 514 is configured to receive reference voltage VSS. A drain and a gate of NFET T5 are both connected to intermediary node NET1. Accordingly, NFET T5 is connected in a diode-configuration. NFET T5 is configured to pull down intermediary node NET1 at or near reference voltage VSS in response to power supply voltage VDD1 being in the first state.

Figure 5B:
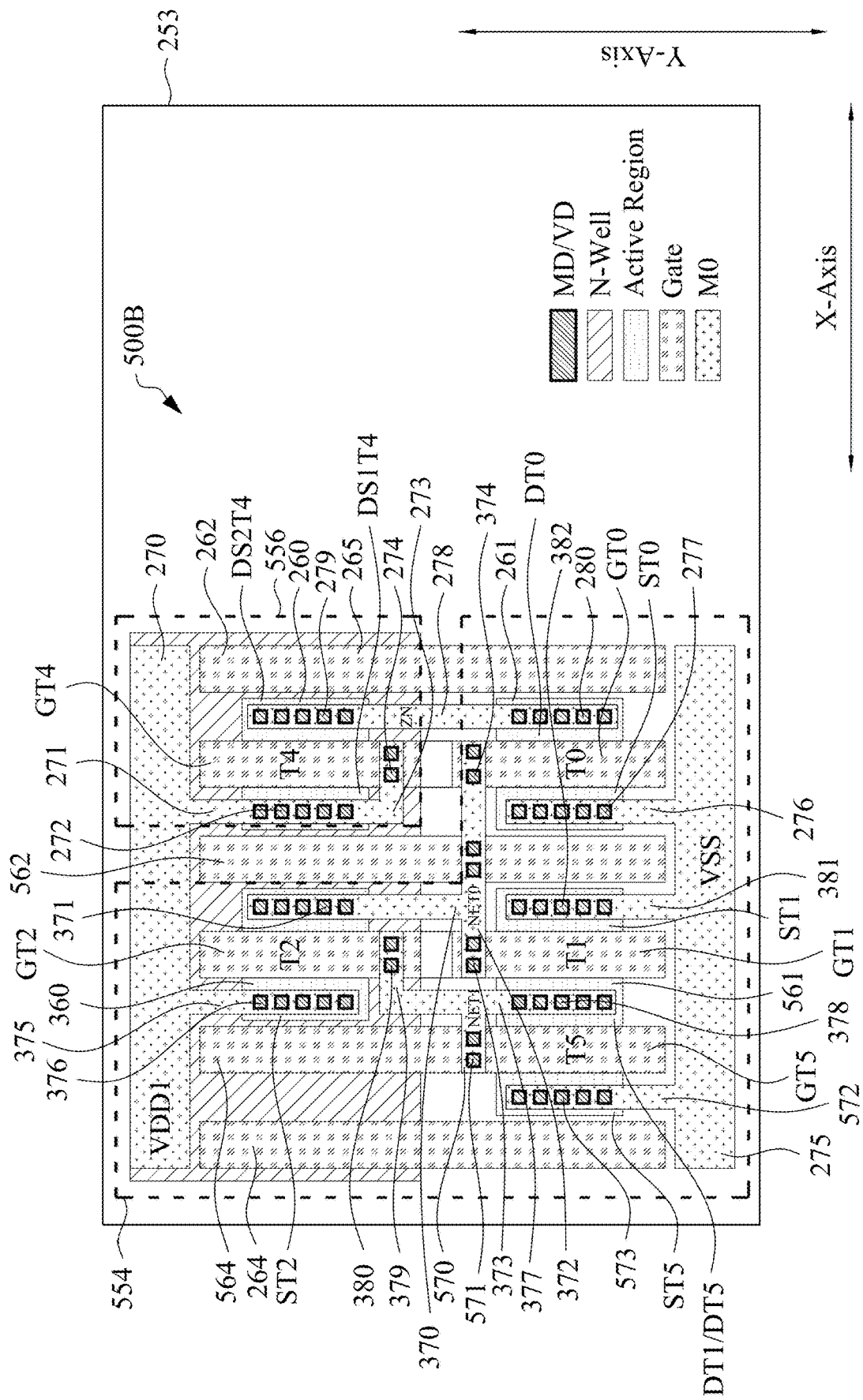
FIG. 5B is a layout diagram of a semiconductor circuit, in accordance with some embodiments.

FIG. 5B is a layout diagram 500B of a semiconductor circuit, in accordance with some embodiments.

The structures in the semiconductor device are represented by shapes (also known as patterns) in the layout diagram. For simplicity of discussion, elements in the layout diagram of FIG. 5B (and of other figures included herein) will be referred to as if they are structures rather than patterns per se. Layout diagram 500B represents a semiconductor circuit that is an example of the circuit 500A shown in FIG. 5A. The semiconductor circuit shown in FIG. 5B is also an example of circuit 101 in FIG. 1.

Layout diagram 500B includes an anti-noise circuit 556, which is similar to the anti-noise circuit 256 described above with respect to FIG. 2B. Layout diagram 500B also includes a tie-low circuit 554 that is similar to tie-low circuit 354 discussed above with respect to FIG. 3B, except that tie-low circuit 554 includes an example of NFET T5 (discussed above with respect to FIG. 5A) and NFET T1 and NFET T5 are formed on active region 561, a gate electrode 562 is located between active regions 260, 360 and active regions 261, 561 relative to the X-axis, and a gate electrode 564 is located between gates GT2, GT1 and gate electrode 564.

In FIG. 5B, the gate electrode 562 is located between active regions 260, 360 and active regions 261, 561 instead of gate electrodes 362, 363 of FIG. 3B. Thus, gate electrode 562 is not separated while gate electrodes 362, 363 are separated. A top portion of gate electrode 562 is formed on N-well 262 between active regions 260, 261 relative to the X-axis. A bottom portion of gate electrode 562 is formed on semiconductor substrate 253 between active regions 261, 561.

Active region 561 is located within semiconductor substrate 253. Active region 561 is an OD region that has N-type conductivity. Active region 561 has a same height with respect to the Y-axis but double the length with respect to the X-axis as active regions 361 in FIG. 3B. A top portion of gate electrode 564 is formed on N-well 262. Top portion of gate electrode 564 is not used to form a FET.

A bottom portion of gate electrode 564 is formed on and over active region 561. Bottom portion of gate electrode 564 is a gate GT5 of NFET T5. Gate GT1 is also formed on and over active region 561 to the right of gate GT5. Portion of active region 561 to the right of gate GT1 is source ST1 of NFET T1. Portion of active region 561 to the left of gate GT1 and right of GT5 is a drain DT1, DT5 of both NFET T1 and NFET T5. Portion of active region 561 to the left of gate GT5 is a source ST5 of NFET T5.

A conductor 570 has a long axis that extends parallel to the X-axis. Conductor 570 extends over gate electrode 564. Vias 571 (only one is labeled for the sake of clarity) connect the conductor 570 to gate GT5. Conductor 570 is connected to conductor 377. Conductor 377 and conductor 379 correspond to intermediary node NET1. In FIG. 5B, conductor 377 is formed over drain DT1, DT5 and vias 378 connect conductor 377 to drains DT1, DT5.

A conductor 572 has a long axis that extends parallel to the Y-axis. Conductor 572 is connected to conductor 275. Conductor 572 extends over source ST5. Vias 573 connect conductor 572 to source ST5. Conductor 572 corresponds to ground node 514 in FIG. 5A.

Conductors 570, 572 are each located in metal layer M0. Vias 571, 573 are each located in MD/VD layer. In other embodiments, conductors 570, 572 are formed and in other metal layers (e.g., metal layer M1, metal layer M2, metal layer M3, etc.) and conductive components in via layers and metal layers underneath conductors 570, 572 connect conductors 570, 572 to the appropriate features in layout diagram 500B.

Figure 6:
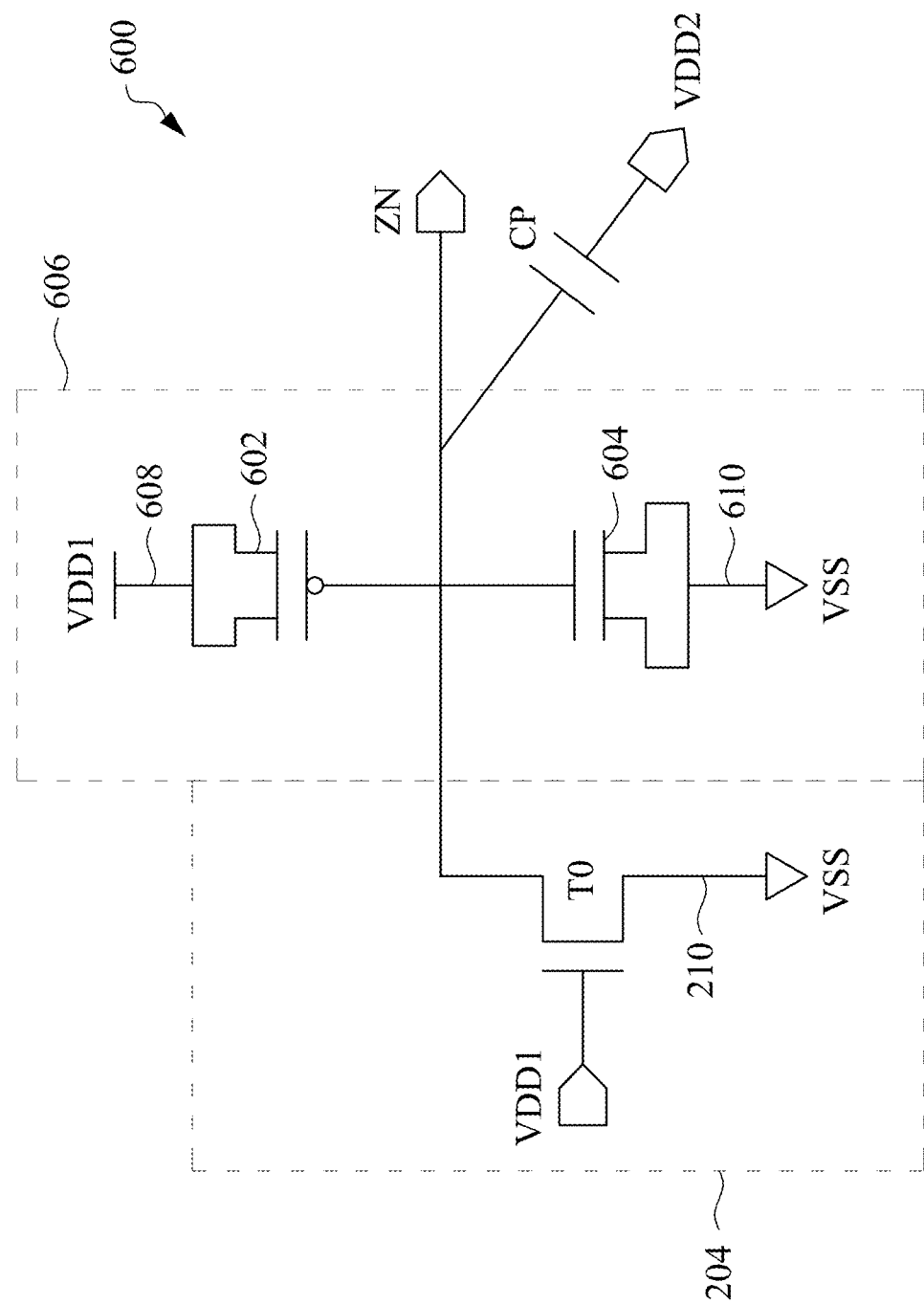
FIG. 6 is a circuit diagram of a circuit, in accordance with some embodiments.

FIG. 6 is a circuit diagram of a circuit 600, in accordance with some embodiments.

Circuit 600 includes tie-low circuit 204 and anti-noise circuit 606. Tie-low circuit 204 is described above with respect to FIG. 2A and is one example of tie-low circuit 104 in FIG. 1. Anti-noise circuit 606 is an example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Anti-noise circuit 606 includes a capacitor-connected PFET 602 a capacitor-connected NFET 604. Capacitor-connected PFET 602 is connected between power supply node 608 and follower node ZN. Power supply node 608 is configured to receive power supply voltage VDD1. More specifically, both drain/source terminals of capacitor-connected PFET 602 are connected to power supply node 608 and thus to each other. A gate of capacitor-connected PFET 602 is connected to follower node ZN.

In FIG. 6, capacitor-connected NFET 604 is connected between a ground node 610 and follower node ZN. Ground node 610 is configured to receive reference voltage VSS. More specifically, both drain/source terminals of capacitor-connected NFET 604 are connected to ground node 610 and thus to each other. A gate of capacitor-connected NFET 604 is connected to follower node ZN.

In operation, capacitor-connected PFET 602 and capacitor-connected NFET 604 are configured to discharge the parasitic noise voltage presented to the follower voltage at the follower node ZN. More specifically, in response to power supply voltage VDD1 being in the second state when power supply voltage VDD2 is in the first state, i.e., when VDD1<VDD2, the parasitic noise voltage at follower node ZN is partially reduced by charging capacitor-connected PFET 602 and is also partially reduced by charging capacitor-connected NFET 604.

Figure 7A:
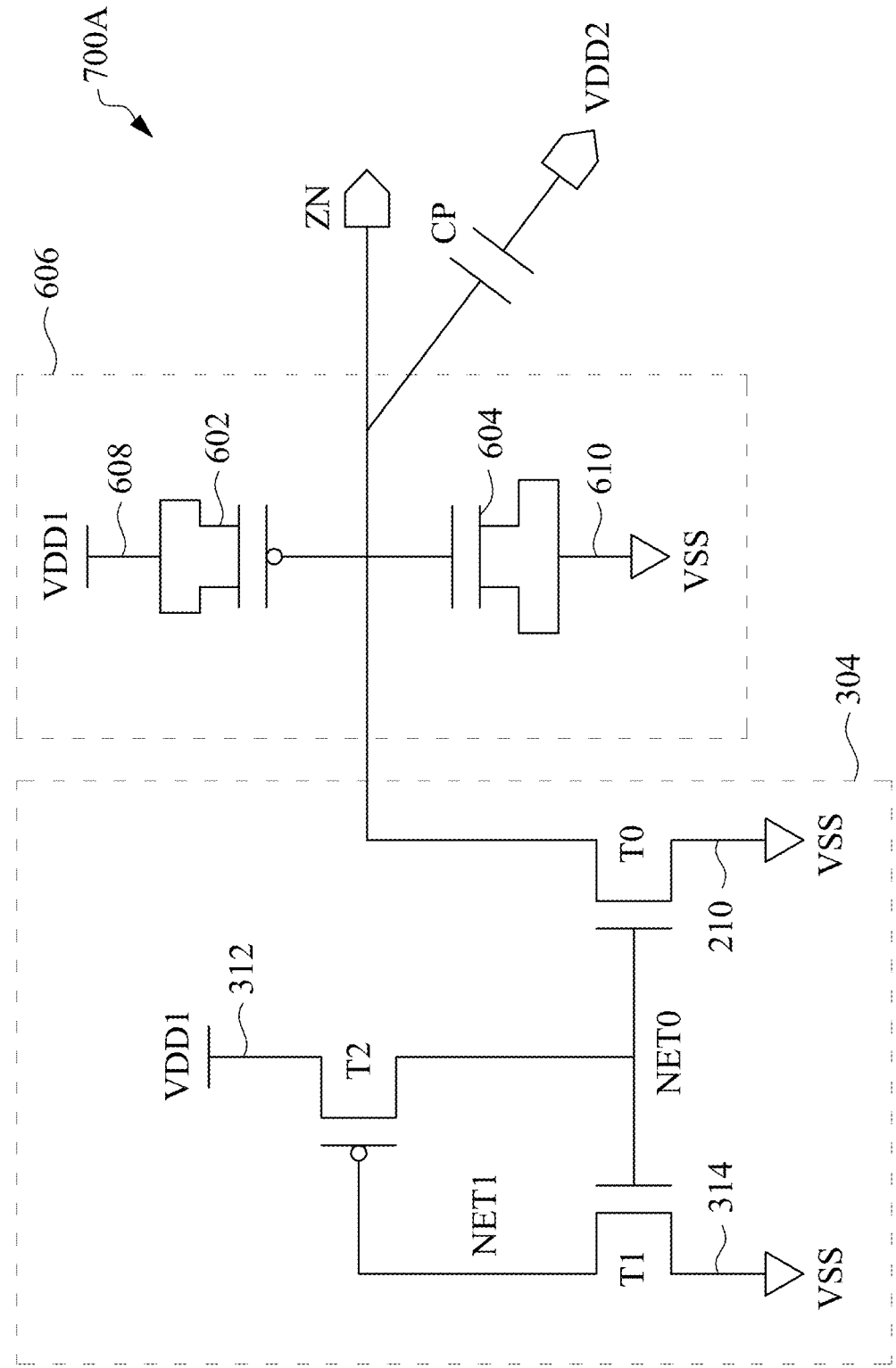
FIG. 7A is a circuit diagram of a circuit, in accordance with some embodiments.

FIG. 7A is a circuit diagram of a circuit 700A, in accordance with some embodiments.

Circuit 700A includes tie-low circuit 304 and anti-noise circuit 606. Tie-low circuit 304 is described above with respect to FIG. 3A and is one example of tie-low circuit 104 in FIG. 1. Anti-noise circuit 606 is described above with respect to FIG. 6 and is one example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Figure 7B:
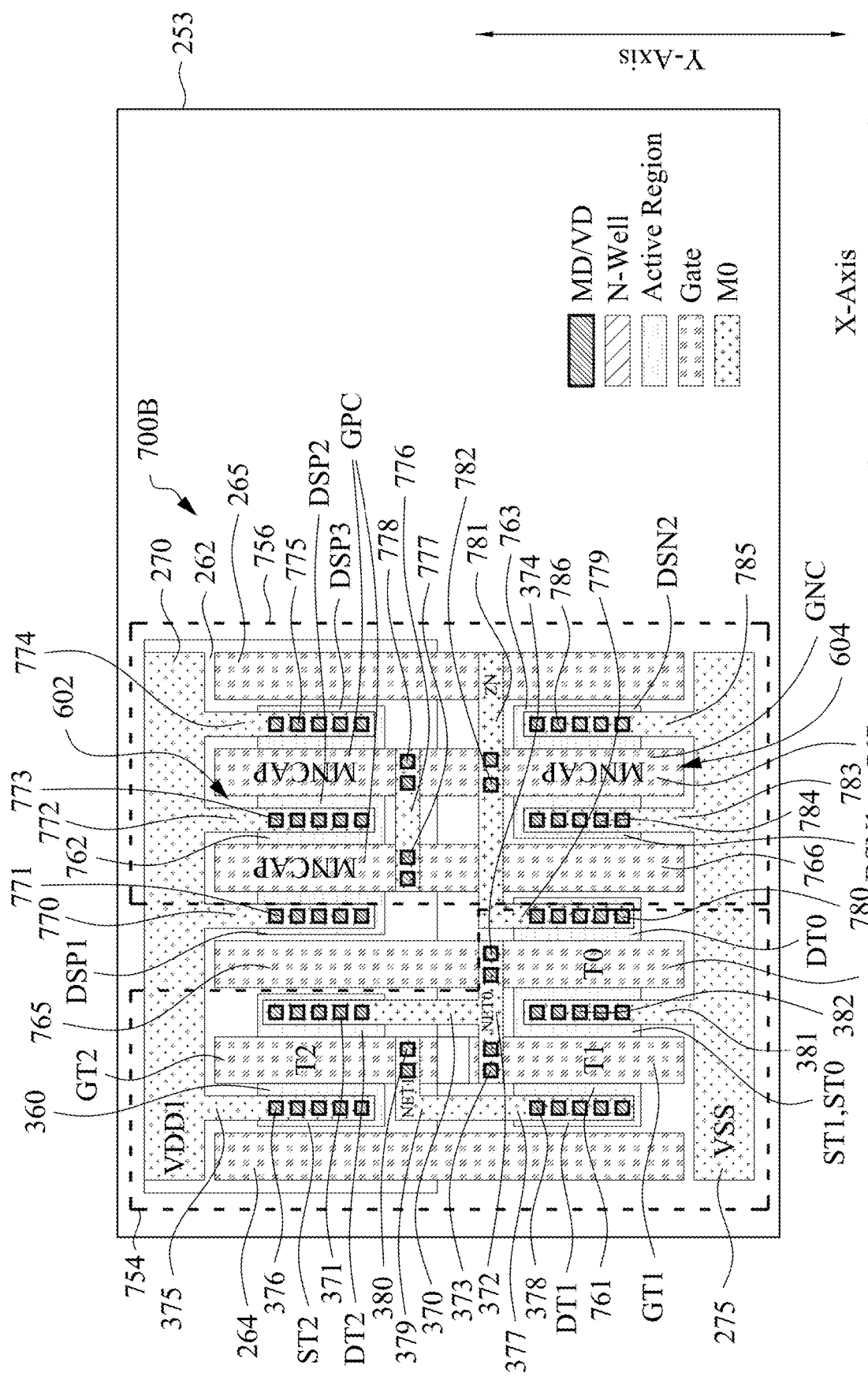
FIG. 7B is a layout diagram of a semiconductor circuit, in accordance with some embodiments.

FIG. 7B is a layout diagram 700B of a semiconductor circuit, in accordance with some embodiments.

The structures in the semiconductor device are represented by shapes (also known as patterns) in the layout diagram. For simplicity of discussion, elements in the layout diagram of FIG. 7B (and of other figures included herein) will be referred to as if they are structures rather than patterns per se. Layout diagram 700B represents a semiconductor circuit that is an example of the circuit 700A shown in FIG. 7A. The semiconductor circuit shown in FIG. 7B is also an example of circuit 101 in FIG. 1.

Layout diagram 700B includes a tie-low circuit 754, which is an example of tie-low circuit 304 in FIG. 7A. Layout diagram 700B also includes an anti-noise circuit 756. Anti-noise circuit 756 is an example of anti-noise circuit 606 in FIG. 7A. In FIG. 7B, active region 360, PFET T2, conductor 370, vias 371, conductor 375, vias 376, conductor 379, vias 380 are arranged in the same manner in FIG. 7B as in FIG. 3B.

In FIG. 7B, NFET T0 and NFET T1 are formed on an active region 761 within semiconductor substrate. Active region 761 is doped to have N-type conductivity and is below active region 360 with respect to the Y-axis. Active region 761 has a same height with respect to the Y-axis and double a length as active region 360. A left half of active region 761 is aligned with respect to the X-axis with active region 360.

An active region 762 is formed to the right of active region 360 within N-well 262. Active region 762 is doped to have P-type conductivity. Active region 762 is aligned with active region 360 with respect to the Y-axis and displaced with respect to the X-axis. Active region 762 has a same height as active region 360 with respect to the Y-axis and double a length with respect to the X-axis.

An active region 763 is formed to the right of active region 761 within semiconductor substrate 253. Active region 763 is doped to have N-type conductivity. Active region 763 is aligned with active region 761 with respect to the Y-axis and displaced with respect to the X-axis. Active region 761 has a same height as active region 763 with respect to the Y-axis and double a length with respect to the X-axis. Active region 763 is aligned with respect to the X-axis with a right half of active region 762.

Gate GT1 is formed on and over left half of active region 761. A gate electrode 765 is formed to the right of gates GT2, GT1. Gate electrode 765 has a long axis that extends parallel to the Y-axis. A top portion of gate electrode 765 is on and over N-well 262 between active region 360 and active region 762. A bottom portion of gate electrode 765 is formed on an over active region 761. Gate electrode 765 is located in Poly layer. The bottom portion of gate electrode 765 is gate GT0 of NFET T0.

A gate electrode 766 is formed to the right of gate electrode 765. Gate electrode 765 has a long axis that extends parallel to the Y-axis. A top portion of gate electrode 766 is on and over the left half of active region 762. A bottom portion of gate electrode 766 is formed on and over semiconductor substrate 253 between active region 761 and active region 763. Gate electrode 766 is located in Poly layer. The top portion of gate electrode 766 is part of the gate GPC of capacitor-connected PFET 602.

A gate electrode 767 is formed to the right of gate electrode 766 and to the left of gate electrode 265. Gate electrode 767 has a long axis that extends parallel to the Y-axis. A top portion of gate electrode 767 is on and over the right half of active region 762. A bottom portion of gate electrode 767 is formed on and over active region 763. Gate electrode 767 is located in Poly layer. The top portion of gate electrode 766 is part of the gate GPC of capacitor-connected PFET 602 and a bottom portion of gate electrode 767 is a gate GNC of capacitor-connected NFET 604.

A portion of active region 761 to the left of gate GT1 is drain DT1 of NFET T1. A portion of active region 761 to the right of gate GT1 and to the left of gate GT0 is a source ST1, ST0 of both NFET T1 and NFET T0. A portion of active region 761 to the right of gate GT0 is drain DT0 of NFET T0.

A portion of active region 762 to the left of gate electrode 766 is a drain/source DSP1 of capacitor-connected PFET 602. A portion of active region 762 to the right of gate electrode 766 and to the left of gate electrode 767 is a drain/source DSP2 of capacitor-connected PFET 602. A portion of active region 762 to the right of gate electrode 767 is a drain/source DSP3 of capacitor-connected PFET 602.

A portion of active region 763 to the left of gate electrode 767 is a drain/source DSN1 of capacitor-connected NFET 604. A portion of active region 763 to the right of gate electrode 767 is a drain/source DSN2 of capacitor-connected NFET 604.

A conductor 770 has a long axis that extends parallel to the Y-axis. Conductor 770 extends over drain/source DSP1. Conductor 770 is connected to conductor 270. Vias 771 (only one is labeled for the sake of clarity) connect conductor 770 to drain/source DSP1.

A conductor 772 has a long axis that extends parallel to the Y-axis. Conductor 772 extends over drain/source DSP2. Conductor 772 is connected to conductor 270. Vias 773 (only one is labeled for the sake of clarity) connect conductor 772 to drain/source DSP2.

A conductor 774 has a long axis that extends parallel to the Y-axis. Conductor 774 extends over drain/source DSP3. Conductor 774 is connected to conductor 270. Vias 775 (only one is labeled for the sake of clarity) connect conductor 774 to drain/source DSP3.

A conductor 776 has a long axis that extends parallel to the X-axis. Conductor 776 extends over top portion of gate electrode 766 and top portion of gate electrode 767. Vias 777 (only one is labeled for the sake of clarity) connect conductor 776 to top portion of gate electrode 766. Vias 778 (only one is labeled for the sake of clarity) connect conductor 776 to top portion of gate electrode 767. In this manner, both portions of gate GPC are connected to one another.

A conductor 779 has a long axis that extends parallel to the Y-axis. Conductor 779 extends over drain DT0. Vias 780 (only one is labeled for the sake of clarity) connect conductor 779 to drain DT0.

A conductor 781 has a long axis that extends parallel to the X-axis. Conductor 781 extends over bottom portion of gate electrode 767 (i.e., gate GNC). Vias 782 (only one is labeled for the sake of clarity) connect conductor 781 to gate GNC. Conductor 781 corresponds to follower node ZN in FIG. 7A.

A conductor 783 has a long axis that extends parallel to the Y-axis. Conductor 783 extends over drain/source DSN1. Conductor 783 is connected to conductor 275. Vias 784 (only one is labeled for the sake of clarity) connect conductor 783 to drain/source DSN1.

A conductor 785 has a long axis that extends parallel to the Y-axis. Conductor 785 extends over drain/source DSN2. Conductor 785 is connected to conductor 275. Vias 786 (only one is labeled for the sake of clarity) connect conductor 785 to drain/source DSN2.

Conductors 770, 772, 774, 776, 779, 781, 783, 785 are each located in metal layer M0. Vias 771, 773, 775, 777, 778, 780, 782, 784, 786 are each located in MD/VD layer. In other embodiments, conductors 770, 772, 774, 776, 779, 781, 783, 785 are formed and in other metal layers (e.g., metal layer M1, metal layer M2, metal layer M3, etc.) and conductive components in via layers and metal layers underneath conductors 770, 772, 774, 776, 779, 781, 783, 785 connect conductors 770, 772, 774, 776, 779, 781, 783, 785 to the appropriate features in layout diagram 700B.

Figure 7C:
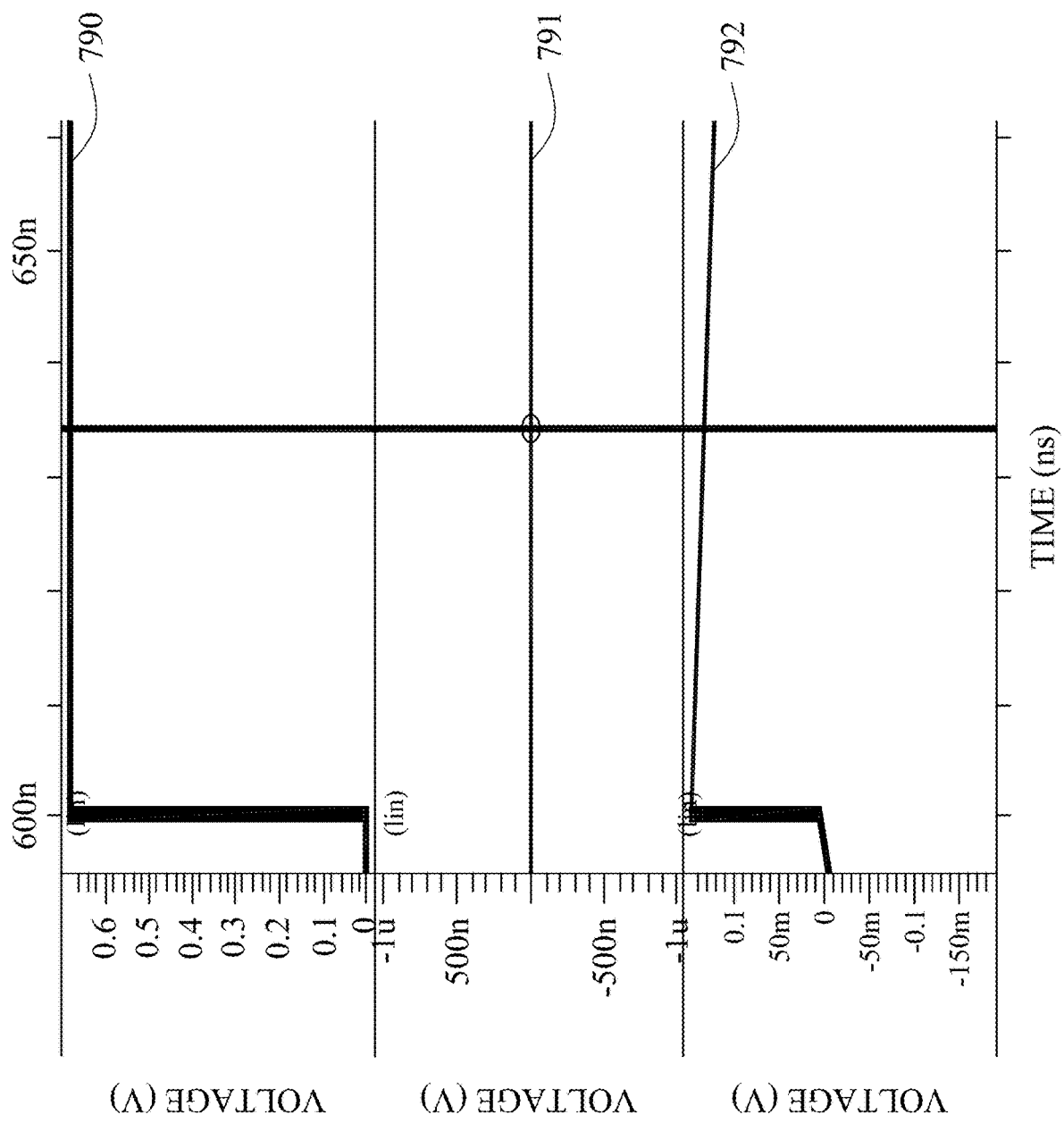
FIG. 7C is a diagram of voltage waveforms of power supply voltages, and follower voltage at follower node of the circuit shown in FIG. 7A.

FIG. 7C is a diagram of voltage waveforms illustrating power supply voltage VDD2, power supply voltage VDD1, and follower voltage at follower node ZN of the circuit 700A shown in FIG. 7A.

The top voltage waveform has a voltage curve 790 for power supply voltage VDD2, where the vertical axis of the top voltage waveform represents a voltage level of power supply voltage VDD2 and a horizontal axis of the top voltage waveform represents time.

The middle voltage waveform has a voltage curve 791 for power supply voltage VDD1, where the vertical axis of the middle voltage waveform represents a voltage level of power supply voltage VDD1 and a horizontal axis of the middle voltage waveform represents time The bottom voltage waveform has a voltage curve 792 for the follower voltage at follower node ZN, where the vertical axis of the bottom voltage waveform represents a voltage level of the follower voltage and a horizontal axis of the bottom voltage waveform represents time.

As shown by voltage curve 791, power supply voltage VDD1 is in the second state (e.g., at or near 0V) during the entire time interval marked from ≈590 ns to ≈660 ns.

As shown by the voltage curve 790, power supply voltage VDD2 operates in the second state (e.g., at or near 0V) from a time interval marked from ≈590 ns to a time marked at ≈600 ns.

As shown by voltage curve 792, follower voltage is ≈0V from a time interval marked from ≈590 ns to a time marked at ≈600 ns.

At a time marked ≈600 ns, the voltage curve 790 shows that power supply voltage VDD2 is switched from the second state to the first state (e.g., at or near 0.675V). As shown by voltage curve 792, this results in a parasitic noise voltage being presented to the follower voltage at follower node ZN rising to ≈0.16V around time marked ≈600 ns.

As shown by voltage curve 790, power supply voltage VDD2 remains in the first state from the time interval marked from ≈600 ns to ≈660 ns.

As shown by voltage curve 792, anti-noise circuit 706 (See FIG. 4A) results in the parasitic noise voltage being offset so as to drop from ≈0.16V to ≈0.131V during the time interval marked from ≈600 ns to ≈660 ns. Anti-noise circuit 706 thus reduces the effects of the parasitic noise voltage at follower node ZN while the power supply voltage VDD1 is in the second state and power supply voltage VDD2 is in the first state.

Figure 8A:
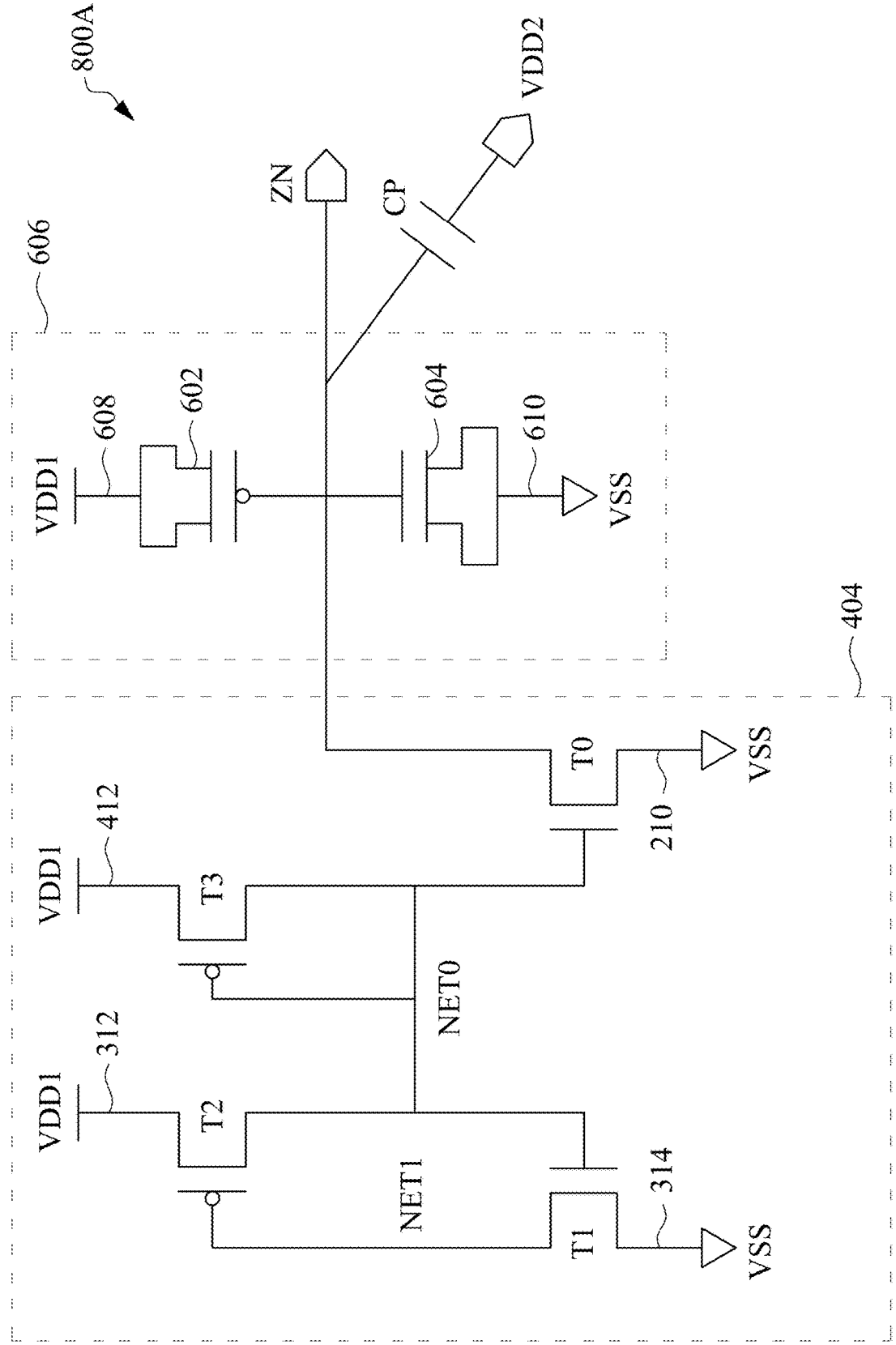
FIG. 8A is a circuit diagram of a circuit, in accordance with some embodiments.

FIG. 8A is a circuit diagram of a circuit 800A, in accordance with some embodiments.

Circuit 800A includes tie-low circuit 404 and anti-noise circuit 606. Tie-low circuit 404 is described above with respect to FIG. 4A and is one example of tie-low circuit 104 in FIG. 1. Anti-noise circuit 606 is described above with respect to FIG. 6 and is one example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Figure 8B:
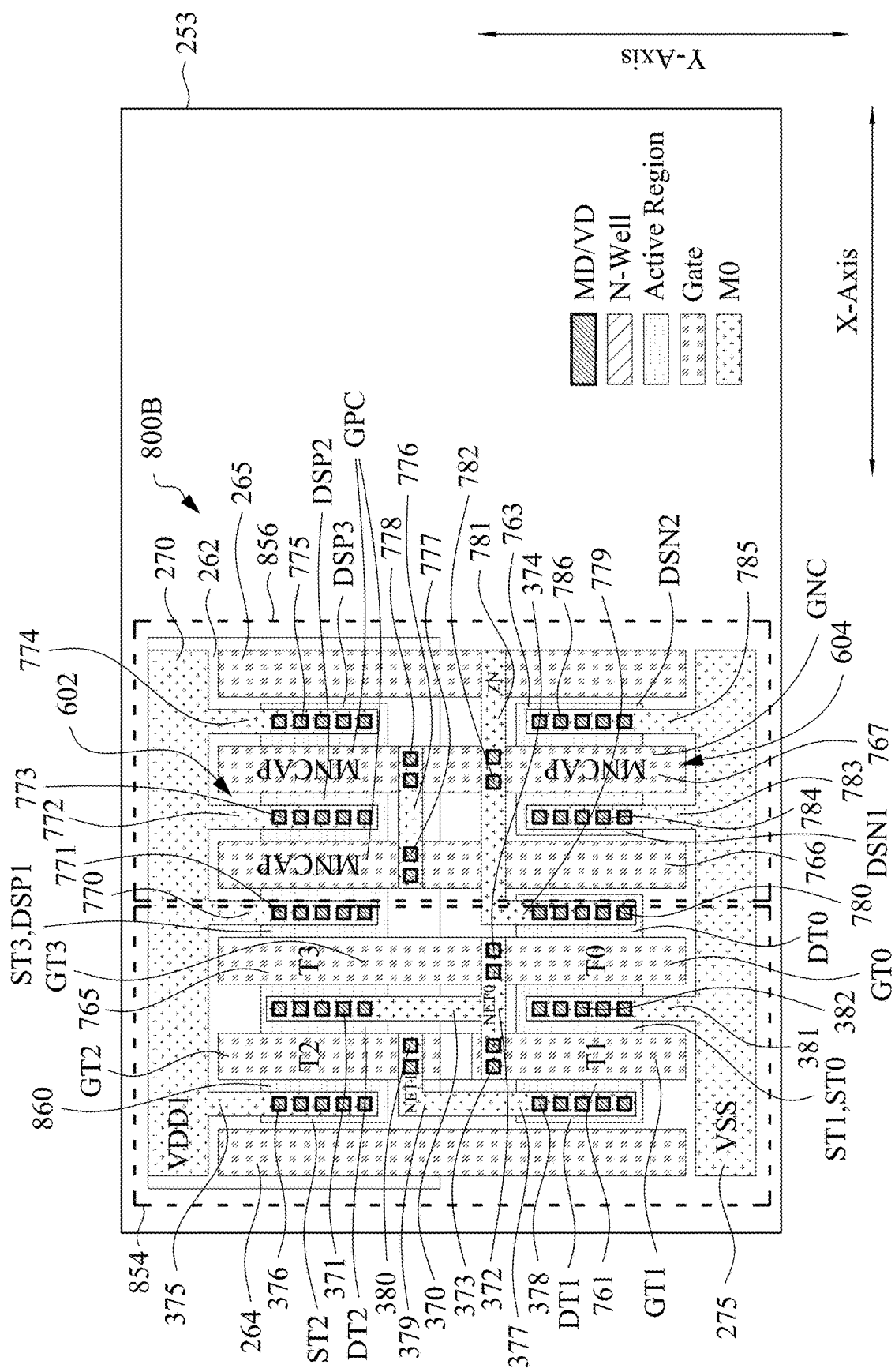
FIG. 8B is a layout diagram of a semiconductor circuit, in accordance with some embodiments.

FIG. 8B is a layout diagram 800B of a semiconductor circuit, in accordance with some embodiments.

The structures in the semiconductor device are represented by shapes (also known as patterns) in the layout diagram. For simplicity of discussion, elements in the layout diagram of FIG. 8B (and of other figures included herein) will be referred to as if they are structures rather than patterns per se. Layout diagram 800B represents a semiconductor circuit that is an example of the circuit 800A shown in FIG. 8A. The semiconductor circuit shown in FIG. 8B is also an example of circuit 101 in FIG. 1.

Layout diagram 800B includes a tie-low circuit 854, which is an example of tie-low circuit 404 in FIG. 8A. Layout diagram 800B also includes an anti-noise circuit 856. Layout diagram 800B is similar to layout diagram 700B in FIG. 7B, except that layout diagram 800B includes a representation of PFET T3 and includes active region 860 instead of active regions 360, 762.

Active region 860 has a same height with respect to the Y-axis but has four times a length as active region 360 in FIG. 7B. Active region 860 is an OD region that is doped to have P-type conductivity. In FIG. 7B, the top portion of gate electrode 765 is formed on and over active region 860 and is a gate GT3 of PFET T3.

Thus, portion of active region 860 to the left of gate GT2 is source ST3. Portion of active region 860 to the right of gate GT2 and to the left of gate GT3 is drain DT2, DT3 of both PFETs T2, T3. Portion of active region 860 to the right of gate GT3 and to the left of gate electrode 766 is source ST3 of PFET T3 and drain/source DSP1 of capacitor-connected PFET 602. Portion of active region 860 to the right of gate electrode 766 and to the left of gate electrode 767 is drain/source DSP2 of capacitor-connected PFET 602. Portion of active region 860 to the right of gate electrode 767 is drain/source DSP3 of capacitor-connected PFET 602.

No additional conductors are needed because PFETs T2, T3 share the same drain DT2, DT3 and since gate electrode 765 provides gates GT3, GT0 of PFETs T3, T0. The connections of conductors 770, 772, 774, 776, 779, 781, 783, 785 as discussed in FIG. 7B thereby provide the connections necessary to form circuit 800A in FIG. 8A.

Figure 9A:
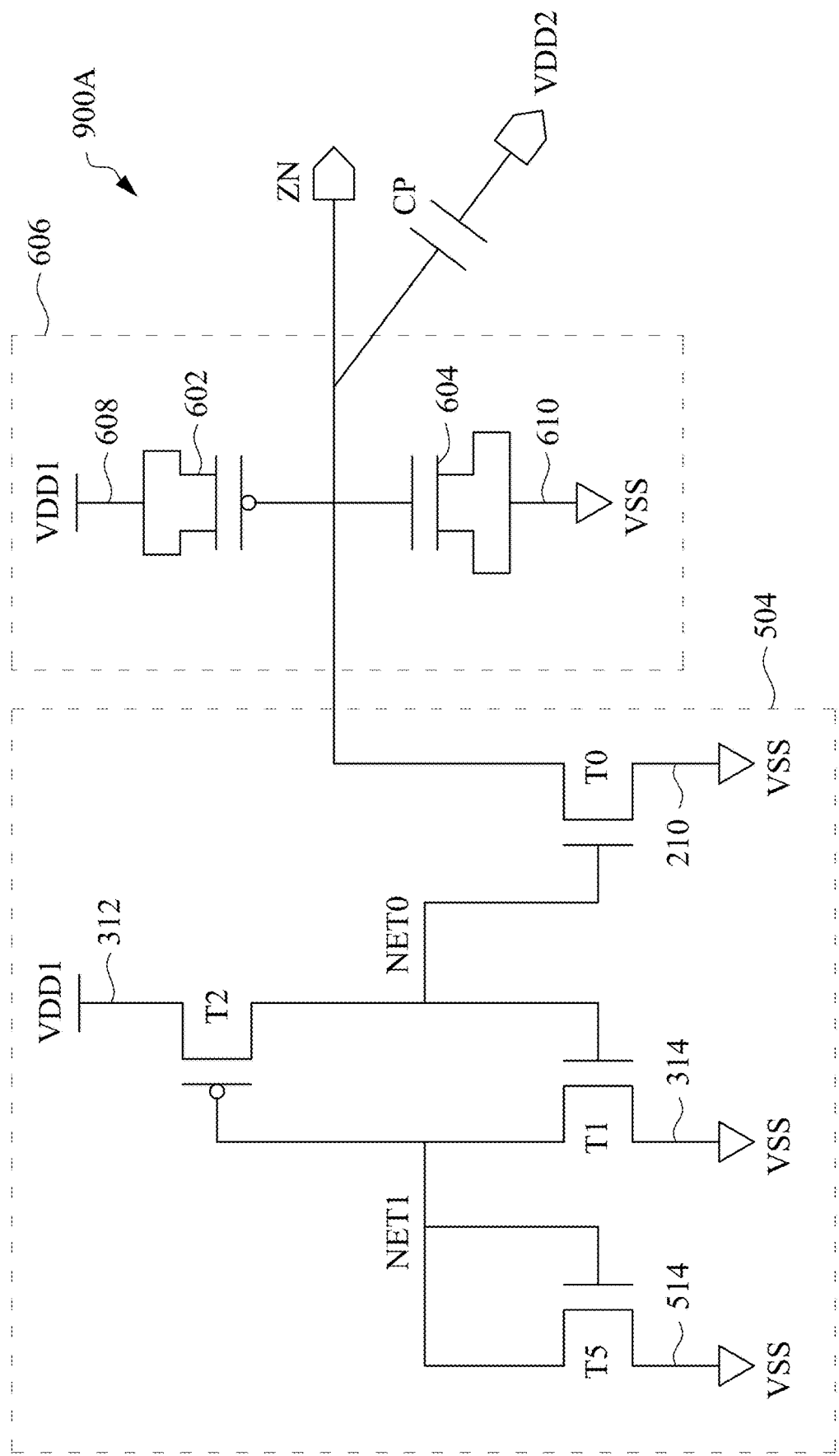
FIG. 9A is a circuit diagram of a circuit, in accordance with some embodiments.

FIG. 9A is a circuit diagram of a circuit 900A, in accordance with some embodiments.

Circuit 900A includes tie-low circuit 504 and anti-noise circuit 606. Tie-low circuit 504 is described above with respect to FIG. 5A and is one example of tie-low circuit 104 in FIG. 1. Anti-noise circuit 606 is described above with respect to FIG. 6 and is one example of anti-noise circuit 106 in FIG. 1. As discussed previously with respect to FIG. 2A, a parasitic capacitance CP causes a parasitic noise voltage to be presented to the follower voltage on follower node ZN in response to power supply voltage VDD2 being in the first state.

Figure 9B:
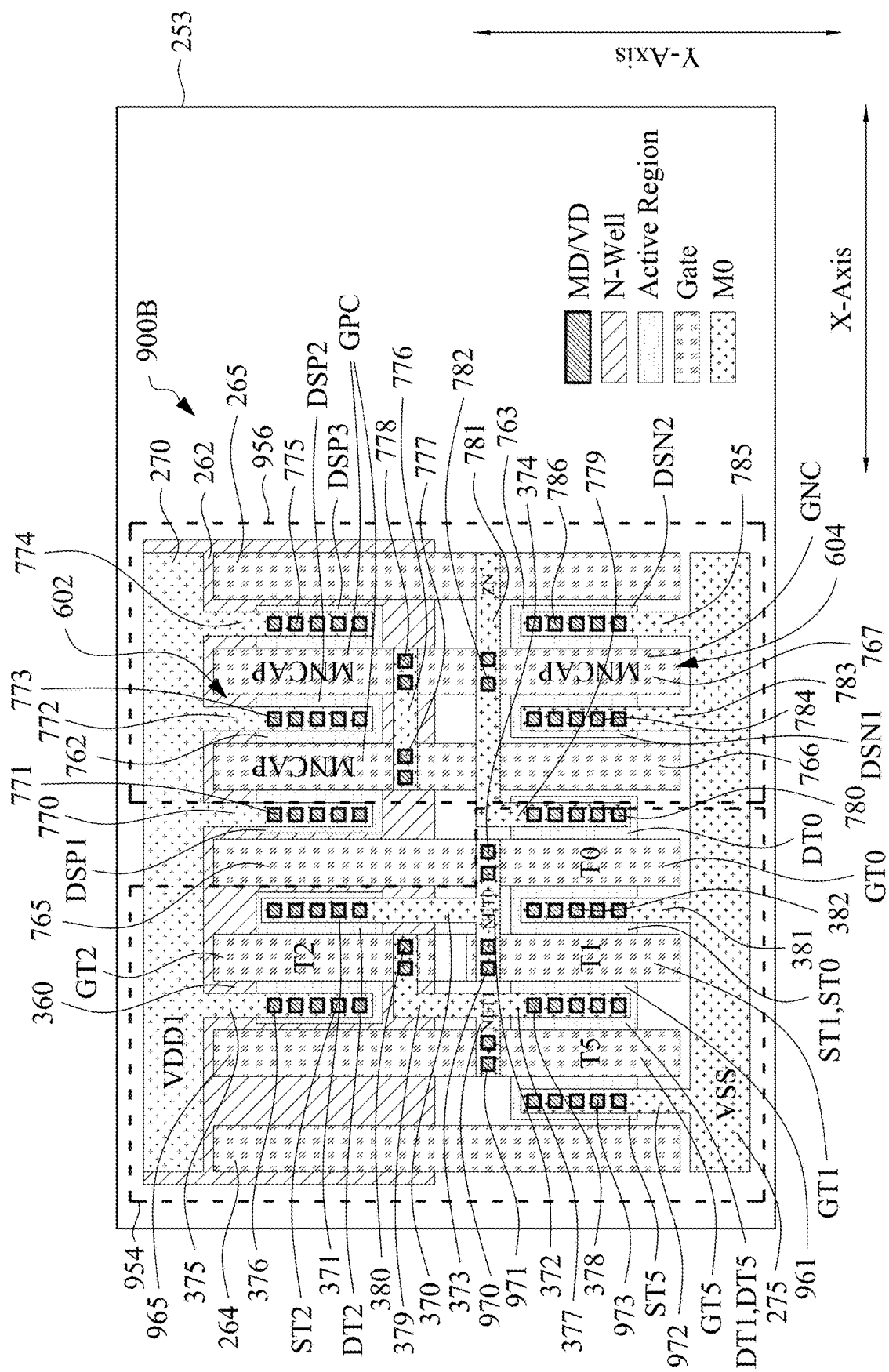
FIG. 9B is a layout diagram of a semiconductor circuit, in accordance with some embodiments.

FIG. 9B is a layout diagram 900B of a semiconductor circuit, in accordance with some embodiments.

The structures in the semiconductor device are represented by shapes (also known as patterns) in the layout diagram. For simplicity of discussion, elements in the layout diagram of FIG. 9B (and of other figures included herein) will be referred to as if they are structures rather than patterns per se. Layout diagram 900B represents a semiconductor circuit that is an example of the circuit 900A shown in FIG. 9A. The semiconductor circuit shown in FIG. 9B is also an example of circuit 101 in FIG. 1.

Layout diagram 900B includes a tie-low circuit 954, which is an example of tie-low circuit 504 in FIG. 9A. Layout diagram 900B also includes an anti-noise circuit 956. Layout diagram 900B is similar to layout diagram 700B in FIG. 7B, except that layout diagram 900B includes a representation of NFET T5 and includes active region 961 instead of active region 761.

Active region 961 has a same height with respect to the Y-axis but has a length that is ≈⅓ longer with respect to the X-axis than active region 761 in FIG. 7B. More specifically, active region 961 extends to the left with respect to the X-axis with this additional ≈⅓ additional length in comparison to active region 761.

In FIG. 9B, a gate electrode 965 is located between gate electrode 264 and gates GT2, GT1. Gate electrode 965 has a long axis that extends parallel to the Y-axis. A top portion of gate electrode 965 is on and over N-well 962. A bottom portion of gate electrode 965 is formed on and over active region 961. Bottom portion of gate electrode 965 is a gate GT5 of NFET N5. Gate electrode 965 is located in Poly layer.

Portion of active region 961 to the left of gate GT5 is a source ST5 of NFET T5. A portion of active region 961 between gate GT5 and gate GT1 is a drain DT1, DT5 of both NFET T1 and NFET T5. A portion of active region 961 to the right of gate GT1 and to the left of gate GT0 is source ST1, ST0 of both NFETs T1, T0. A portion of active region 961 to the right of gate T0 is drain DT0 of NFET T0.

A conductor 970 has a long axis that extends parallel to the X-axis. Conductor 970 extends over bottom portion of gate electrode 965 (i.e., gate GT5). Vias 971 (only one is labeled for the sake of clarity) connect conductor 970 to gate GT5. Conductor 970 is connected to conductor 377.

A conductor 972 has a long axis that extends parallel to the Y-axis. Conductor 972 extends over source ST5. Conductor 972 is connected to conductor 275. Vias 973 (only one is labeled for the sake of clarity) connect conductor 972 to source ST5.

Conductors 970, 972 are each located in metal layer M0. Vias 971, 973 are each located in MD/VD layer. In other embodiments, conductors 970, 972 are formed and in other metal layers (e.g., metal layer M1, metal layer M2, metal layer M3, etc.) and conductive components in via layers and metal layers underneath conductors 970, 972 connect conductors 970, 972 to the appropriate features in layout diagram 900B.

Figure 10:
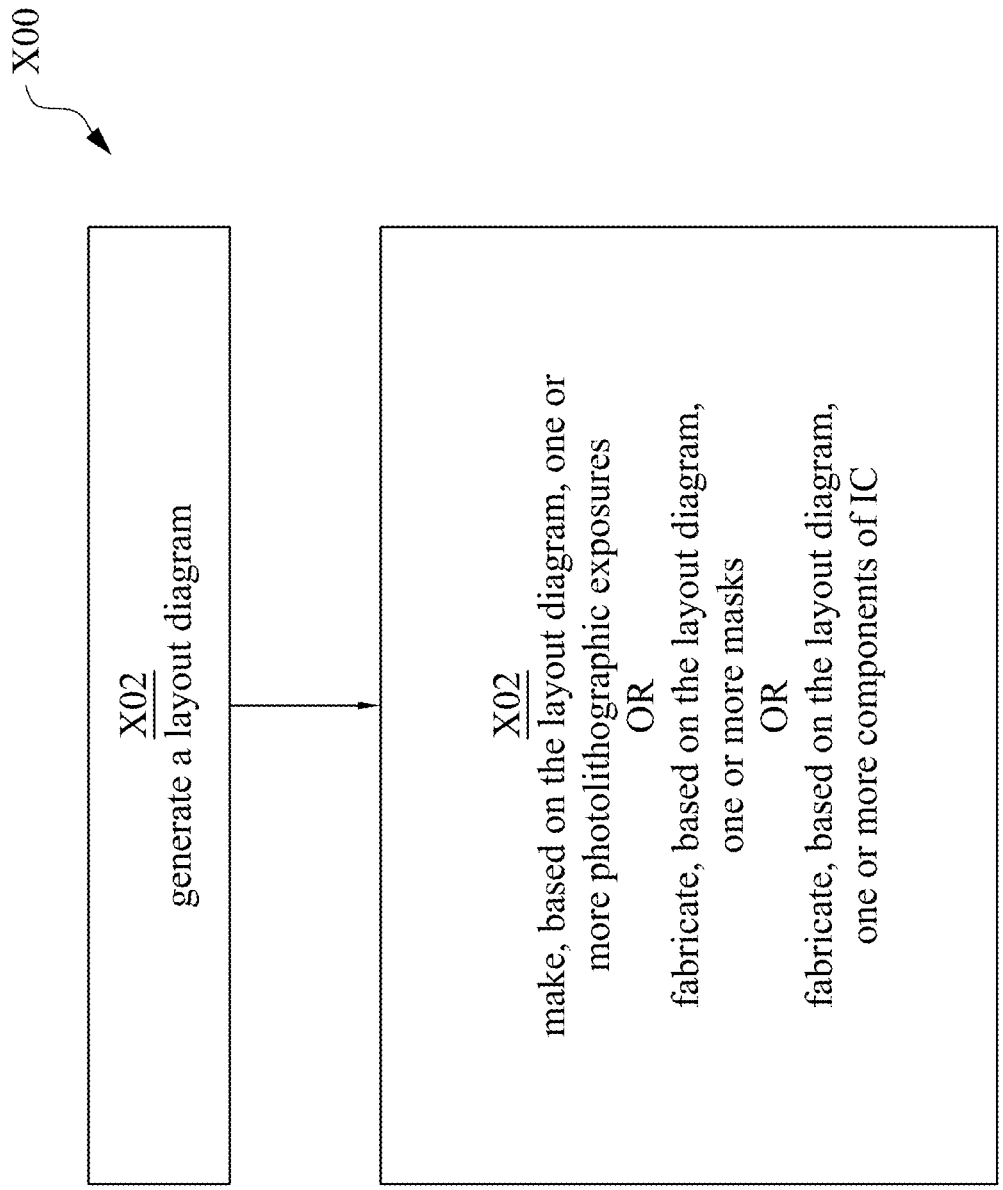
FIG. 10 is a flowchart of a method of manufacturing a semiconductor device, in accordance with some embodiments.

FIG. 10 is a flowchart of a method 1000 of manufacturing a semiconductor device, in accordance with some embodiments.

Method 1000 is implementable, for example, using EDA system 1300 (FIG. 13, discussed below) and an integrated circuit (IC) manufacturing system 1400 (FIG. 14, discussed below), in accordance with some embodiments.

In FIG. 10, method 1000 includes blocks 1002-1004. At block 1002, a layout diagram is generated. Example layout diagrams that are generated at block 1002 include a layout diagram 200B in FIG. 2B, layout diagram 300B in FIG. 3B, layout diagram 400B in FIG. 4B, layout diagram 500B in FIG. 5B, layout diagram 600B in FIG. 6B, layout diagram 700B in FIG. 7B, layout diagram 800B in FIG. 8B, layout diagram 900B in FIG. 9B, or the like.

At block 1004, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 1400 in FIG. 14 below.

Figure 11:
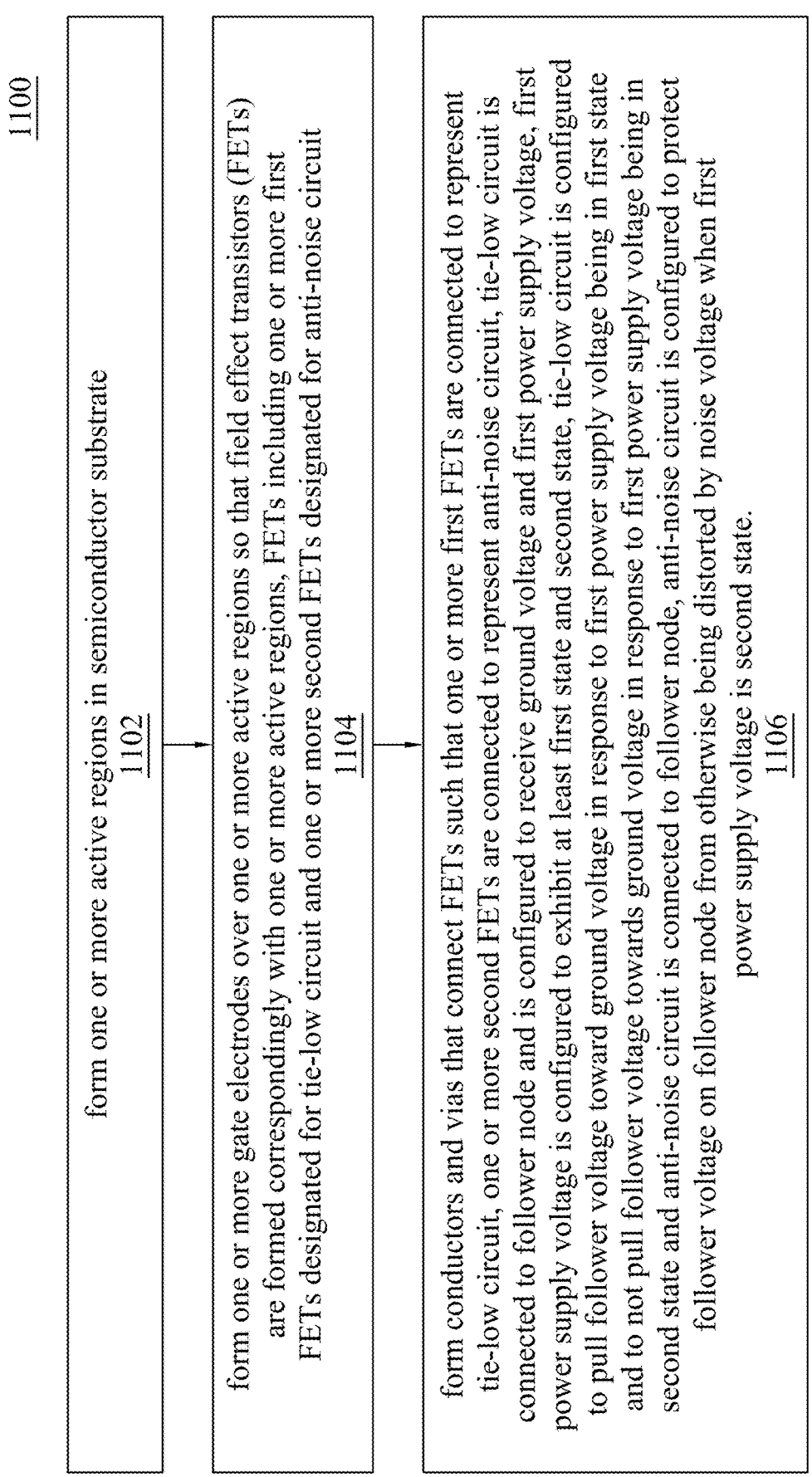
FIG. 11 is a flowchart of a method of fabricating a semiconductor circuit, in accordance with some embodiments.

FIG. 11 is a flowchart 1100 of a method of fabricating a semiconductor circuit, in accordance with some embodiments.

Flowchart 1100 is one example of block 1004 in FIG. 10. Examples of the semiconductor circuit include circuit 101 in FIG. 1, circuit 200A in FIG. 2A, the circuit represented by layout diagram 200B in FIG. 2B, the circuit 300A in FIG. 3A, the circuit represented by layout diagram 300B in FIG. 3B, circuit 400A in FIG. 4A, the circuit represented by layout diagram 400B in FIG. 4B, circuit 500A in FIG. 5A, the circuit represented by layout diagram 500B in FIG. 5B, circuit 600 in FIG. 6, circuit 700A in FIG. 7A, the circuit represented by layout diagram 700B in FIG. 7B, circuit 800A in FIG. 8A, the circuit represented by layout diagram 800B in FIG. 8B, circuit 900A in FIG. 9A, and the circuit represented by layout diagram 900B in FIG. 9B.

In FIG. 11, flowchart 1100 includes blocks 1102, 1104 and 1106. Flow begins at block 1102. At block 1102, one or more active regions are formed in a semiconductor substrate. Examples of active regions include active regions 260, 261 in FIG. 2B, active regions 260, 261, 360, 361 in FIG. 3B, active regions 261, 361, 460 in FIG. 4B, active regions 260, 261, 360, 561 in FIG. 5B, active regions 360, 761, 762, 763 in FIG. 7B, active regions 761, 763, 860 in FIG. 8B, active regions 360, 762, 763, 961 in FIG. 9B, or the like. Examples of the semiconductor substrate include semiconductor substrate 103 in FIG. 1 and semiconductor substrate in FIG. 2B, 3B, 4B, 5B, 7B, 8B, 9B, or the like. Flow then proceeds to block 1104.

At block 1104, one or more gate electrodes are formed over the one or more active regions so that field effect transistors (FETs) are formed correspondingly with the one or more active regions, the FETs including one or more first FETs designated for a tie-low circuit and one or more second FETs designated for an anti-noise circuit. Examples of the gate electrodes include gate electrode 263 in FIG. 2B, gates GT0, GT1, GT2, GT4 in FIG. 3B, gates GT0, GT1, GT2, GT3, GT4 in FIG. 4B, gate electrode 564 and gates GT0, GT1, GT2, GT3, GT4 in FIG. 5B, gate electrodes 765, 766, 767 and gates GT1, GT2 in FIG. 7B, gate electrodes 765, 766, 767 and gates GT1, GT2 in FIG. 8B, and gate electrodes 765, 766, 767, 965 and gates GT1, GT2 in FIG. 9B, or the like. Examples of the first FETs include NFET T0 in FIG. 2B, FETs T0, T1, T2 in FIG. 3B and FIG. 7B, FETs T0, T1, T2, T3 in FIG. 4B and FIG. 8B, and FETs T0, T1, T2, T5 in FIG. 5B and FIG. 9B. Examples of second FETs include PFET T4 in FIG. 2B, 3B, 4B, 5B and FETs 602, 604 in FIGS. 7B, 8B, and 9B, or the like. Examples of the tie-low circuit include tie-low circuit 254 in FIG. 2B, tie-low circuit 354 in FIG. 3B, tie-low circuit 454 in FIG. 4B, tie-low circuit 554 in FIG. 5B, tie-low circuit 754 in FIG. 7B, tie-low circuit 854 in FIG. 8B, tie-low circuit 954 in FIG. 9B, or the like. Examples of the anti-noise circuit include anti-noise circuit 256 in FIG. 2B, anti-noise circuit 356 in FIG. 3B, anti-noise circuit 456 in FIG. 4B, anti-noise circuit 556 in FIG. 5B, anti-noise circuit 756 in FIG. 7B, anti-noise circuit 856 in FIG. 8B, and anti-noise circuit 956 in FIG. 9B, or the like. Flow then proceeds to block 1106.

At block 1106, conductors and vias are formed that connect the FETs such that the one or more first FETs are connected to represent the tie-low circuit, the one or more second FETs are connected to represent the anti-noise circuit, the tie-low circuit is connected to a follower node and is configured to receive a ground voltage and a first power supply voltage, the first power supply voltage is configured to exhibit at least a first state and a second state, the tie-low circuit is configured to pull a follower voltage toward the ground voltage in response to the first power supply voltage being in the first state and to not pull the follower voltage towards the ground voltage in response to the first power supply voltage being in the second state and the anti-noise circuit is connected to the follower node, and the anti-noise circuit is configured to protect the follower voltage at the follower node from otherwise being distorted by a noise voltage when the first power supply voltage is the second state. Examples of the conductors are the conductors discussed above in metal layer M0 in FIG. 2B, 3B, 4B, 5B, 7B, 8B, 9B and examples of vias are vias discussed above formed in MD/VD layer in FIG. 2B, 3B, 4B, 5B, 7B, 8B, 9B, or the like. Examples of the follower node are follower node ZN in FIG. 2B, 3B, 4B, 5B, 7B, 8B, 9B, or the like. Examples of the ground voltage are reference voltage VSS in FIG. 2B, 3B, 4B, 5B, 7B, 8B, 9B, or the like. Examples of the first power supply voltage are power supply voltage VDD1 in FIG. 2B, 3B, 4B, 5B, 7B, 8B, 9B, or the like.

Figure 12:
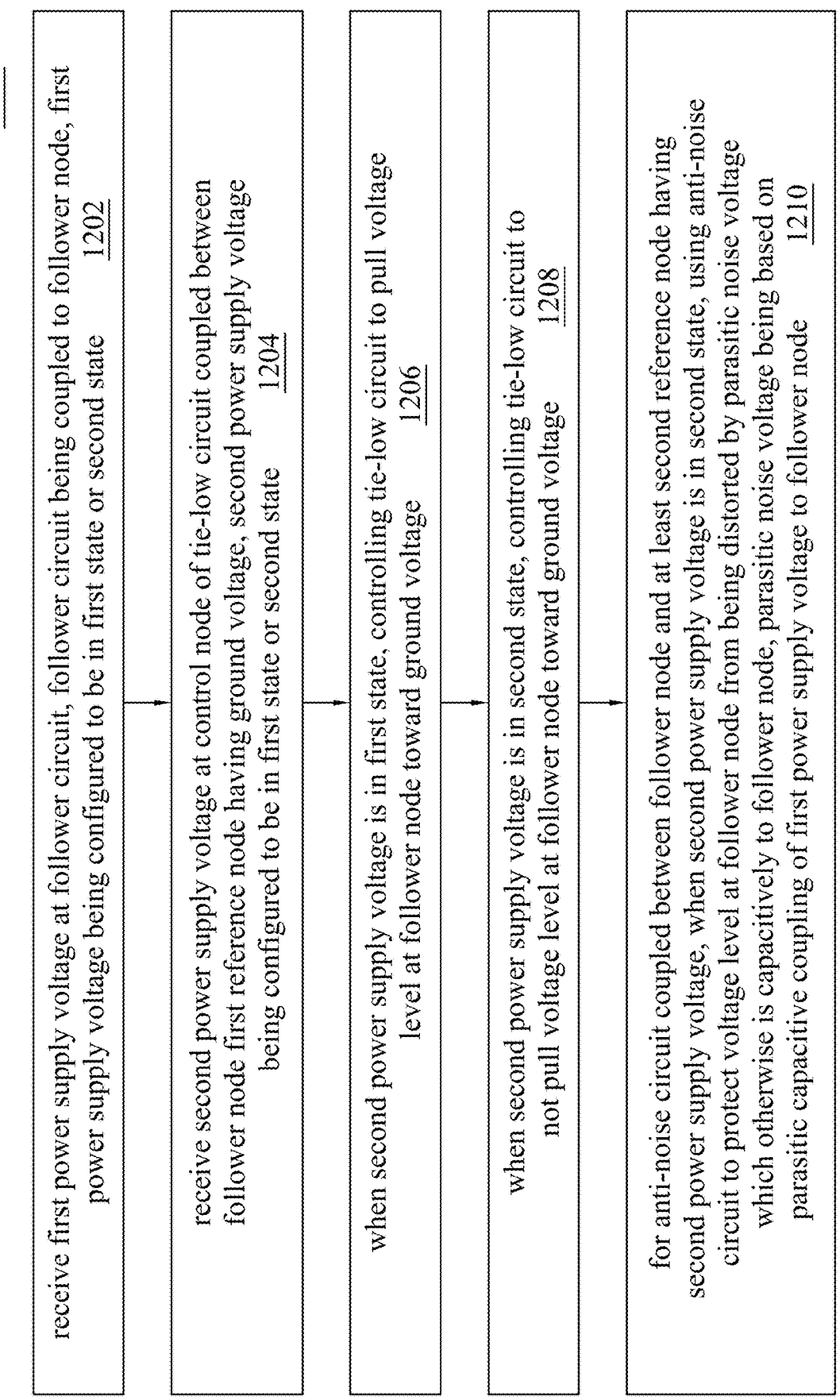
FIG. 12 is a flowchart of a method of protecting a circuit from parasitic noise, in accordance with some embodiments.

FIG. 12 is a flowchart 1200 of a method of protecting a circuit from parasitic noise, in accordance with some embodiments.

The method of flowchart 1200 corresponds to the operation of the circuits of FIGS. 1, 2A, 3A, 4A, 5A, 6, 7A, 8A, 9A, or the like. Flowchart 1200 includes blocks 1202-1210.

Flow begins at block 1202. At block 1202, a first power supply voltage is received at a follower circuit, the follower circuit being coupled to a follower node, the first power supply voltage being configured to be in a first state or a second state. An example of the follower circuit is follower circuit 108 in FIG. 1. An example of the follower node is follower node ZN in FIGS. 1, 2A, 2B, 3A, 3B, 4A, 4B, 5A, 5B, 6, 7A, 7B, 8A, 8B, 9A, 9B. An example of the first power supply voltage is power supply voltage VDD2. Examples of power supply voltage VDD2 are shown in FIGS. 2A, 2B, 3A, 3B, 4A, 4B, 5A, 5B, 6, 7A, 7B, 8A, 8B, 9A, 9B, voltage waveform 490 in FIG. 4C, and voltage waveform 790 in FIG. 7C. Flow proceeds to block 1204.

At block 1204, a second power supply voltage is received at control node of a tie-low circuit coupled between the follower node and a first reference node having a ground voltage, the second power supply voltage being configured to be in a first state or a second state. An example of the second power supply voltage is the power supply voltage VDD1. Examples of power supply voltage VDD1 are shown in 2A, 2B, 3A, 3B, 4A, 4B, 5A, 5B, 6, 7A, 7B, 8A, 8B, 9A, 9B, voltage waveform 491 in FIG. 4C, and voltage waveform 791 in FIG. 7C. In FIG. 4C and FIG. 7C, power supply voltage VDD1 is shown in the second state. Flow then proceeds to block 1206. Examples of control node are the gate of NFET T0 in FIGS. 2A, 3A, 4A, 5A, 6, 7A, 8A, 9A. Examples of tie-low circuit are tie-low circuit 104 in FIG. 1, tie-low circuit 204 in FIGS. 2A, 6, tie-low circuit 304 in FIGS. 3A, 7A tie-low circuit 404 in FIGS. 4A, 8A, tie-low circuit 504 in FIGS. 5A, 9A, tic-low circuit 254 in FIG. 2B, tie-low circuit 354 in FIG. 3B, tie-low circuit 454 in FIG. 4B, tie-low circuit 554 in FIG. 5B, tie-low circuit 754 in FIG. 7B, tie-low circuit 854 in FIG. 8B, and tie-low circuit 954 in FIG. 9B. Flow then proceeds to block 1206.

At block 1206, when the second power supply voltage is in the first state, the tie-low circuit is controlled to pull a voltage level at the follower node toward the ground voltage. Examples are shown in voltage waveforms 492 in FIG. 4C and voltage waveform 792 in FIG. 7C before the time marked at 590 ns. Flow then proceeds to block 1208.

At block 1208, when the second power supply voltage is in the second state, the tie-low circuit is controlled to not pull the voltage level at the follower node toward the ground voltage. Examples are shown in voltage waveforms 492 in FIG. 4C and voltage waveform 792 in FIG. 7C after the time marked at 590 ns. Flow then proceeds to block 1210.

At block 1210, for an anti-noise circuit coupled between the follower node and at least a second reference node having the second power supply voltage, when the second power supply voltage is in the second state, the anti-noise circuit is used to protect the voltage level at the follower node from being distorted by a parasitic noise voltage which otherwise is capacitively to the follower node, the parasitic noise voltage being based on a parasitic capacitive coupling of the first power supply voltage to the follower node. Examples are shown in voltage waveforms 492 in FIG. 4C and voltage waveform 792 in FIG. 7C when parasitic noise voltage drops after the time marked at 590 ns. Examples of anti-noise circuit include anti-noise circuit 106 in FIG. 1, anti-noise circuit 206 in FIGS. 2A, 3A, 4A, 5A, anti-noise circuit 606 in FIGS. 6, 7A, 8A, 9A, anti-noise circuit 256 in FIG. 2B, anti-noise circuit 356 in FIG. 3B, anti-noise circuit 456 in FIG. 4B, anti-noise circuit 556 in FIG. 5B, anti-noise circuit 756 in FIG. 7B, anti-noise circuit 856 in FIG. 8B, and anti-noise circuit 956 in FIG. 9B.

Figure 13:
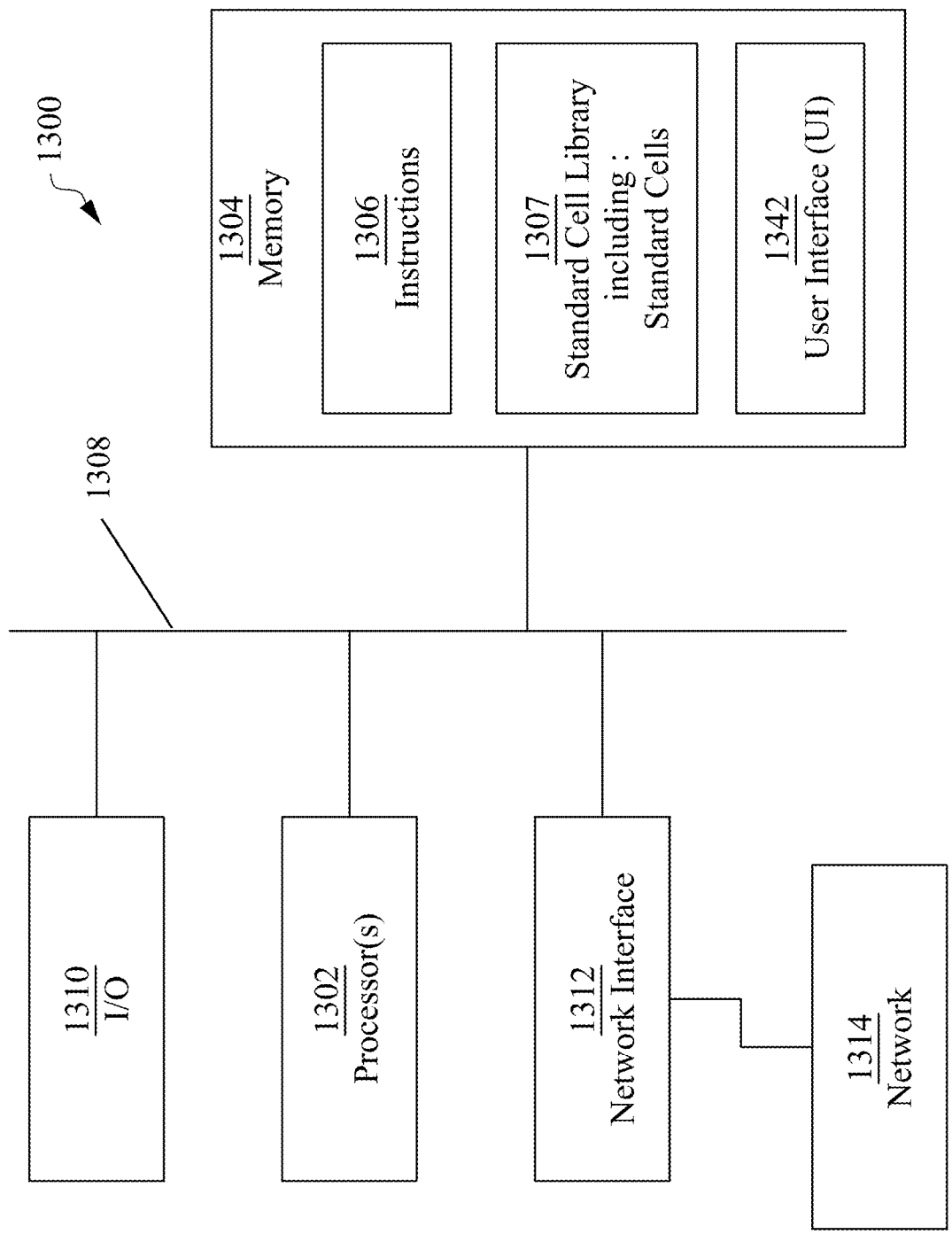
FIG. 13 is a block diagram of an EDA system, in accordance with some embodiments.

FIG. 13 is a block diagram of an EDA system 1300, in accordance with some embodiments.

In some embodiments, EDA system 1300 includes an APR system. Methods described herein of designing layout diagrams, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code 1306, i.e., a set of executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DMD/VD).

In one or more embodiments, storage medium 1304 stores computer program code 1306 configured to cause system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein. In one or more embodiments, storage medium 1304 stores one or more layout diagrams 1309 corresponding to one or more layouts disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

System 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DMD/VD, a magnetic disk, such as a hard disk, a semiconductor memory, such as a ROM, a RAM, a memory card, and the like.

Figure 14:
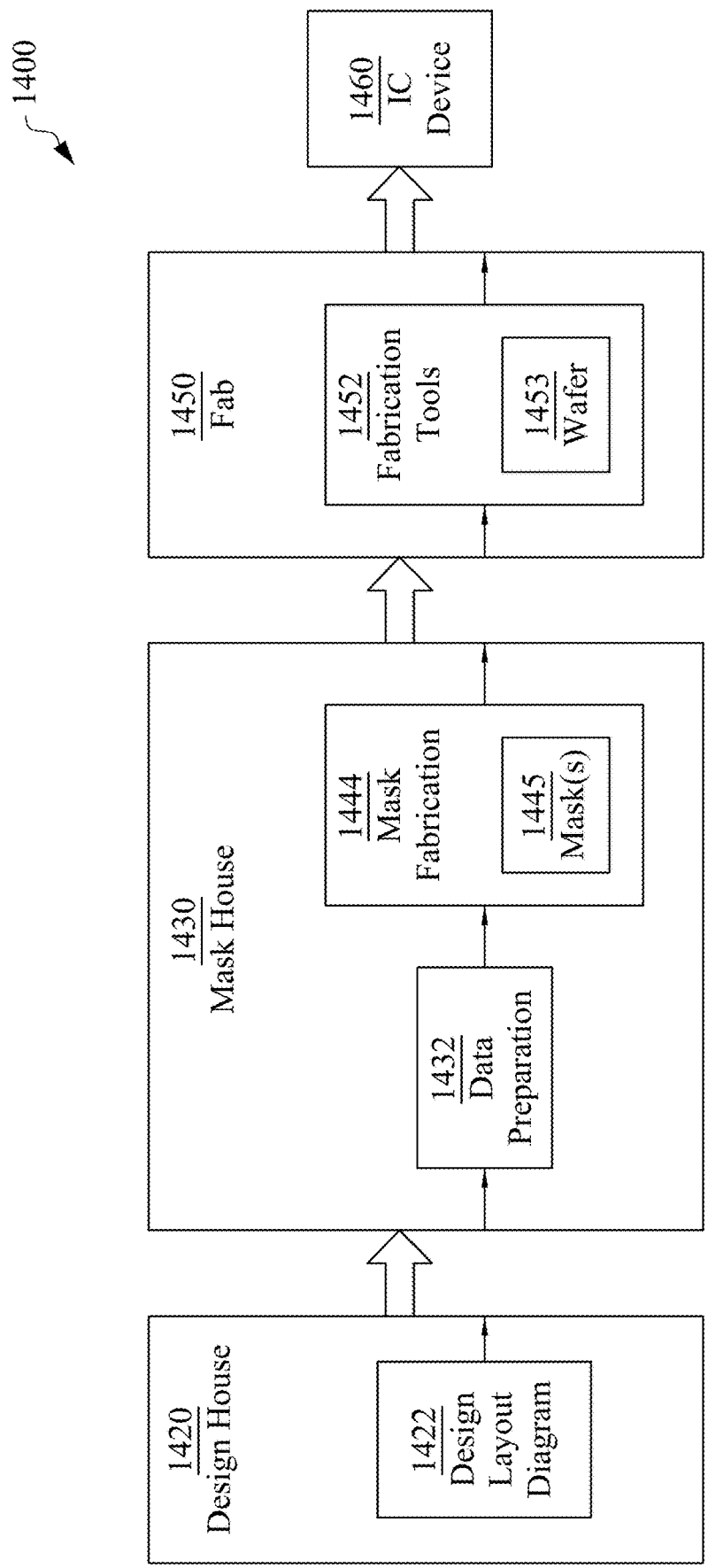
FIG. 14 is a block diagram of an IC manufacturing system, and an IC manufacturing flow associated therewith, in accordance with some embodiments.

FIG. 14 is a block diagram of an IC manufacturing system 1400, and an IC manufacturing flow associated therewith, in accordance with some embodiments.

In some embodiments, based on a layout diagram, e.g., at least one of (A) one or more semiconductor masks or (b) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 is expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 is collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 is formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift mask technology. In a phase shift mask (PSM) version of mask 1445, various features in the pattern formed on the phase shift mask are configured to have proper phase difference to enhance the resolution and imaging quality. In various examples, the phase shift mask is attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CMD/VD chamber or LPCMD/VD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a circuit to shape a follower voltage for a follower circuit, the circuit including: a tie-low circuit connected between a follower node and a first reference voltage, the tic-low circuit being responsive to a second reference voltage, the follower node being connectable to the follower circuit; and an anti-noise circuit connected between the follower node and the second reference voltage, the anti-noise circuit being configured to protect the follower voltage at the follower node from otherwise being distorted by a noise voltage being coupled capacitively to the follower node.

In some embodiments, the first reference voltage is a ground voltage; the second reference voltage is a first power supply voltage that has a level which exhibits fluctuation; and the tie-low circuit is further configured to: pull the follower node down towards the ground voltage in response to a level of the first power supply voltage exceeding a threshold level of the tic-low circuit; and substantially not affect the follower node in response to the level of the first power supply voltage falling below the threshold level of the tic-low circuit. In some embodiments, the noise voltage coupled capacitively to the follower node includes a parasitic voltage resulting from a second power supply voltage in a power domain in of the follow circuit; and the anti-noise circuit being further configured to protect the follower node by at least one of either: 1) discharging the parasitic voltage at the follower node, or 2) offsetting the parasitic voltage at the follower node. In some embodiments, the anti-noise circuit includes: a power supply node configured to receive the first power supply voltage; and a diode-connected field effect transistor (FET) connected between the power supply node and the follower node such that the diode-connected FET is forward biased so as to discharge the follower node through the power supply node when the level of the first power supply voltage is less than a level of the parasitic voltage. In some embodiments, the diode-connected FET is a P-channel FET (PFET), the PFET having a first drain/source terminal, a second drain/source terminal, and a gate terminal; the first drain/source terminal is connected to the power supply node; the gate terminal is connected to the first drain/source; and the second drain/source terminal is connected to the follower node. In some embodiments, the anti-noise circuit includes: a capacitor-connected P-channel field effect transistor (PFET) connected to the follower node, and a capacitor-connected N-channel field effect transistor (NFET) connected to the follower node; and the capacitor-connected PFET and the capacitor-connected NFET are configured to offset the noise voltage at the follower node. In some embodiments, the anti-noise circuit further includes: a power supply node configured to receive the first power supply voltage; a ground node configured to receive the ground voltage; the capacitor-connected PFET is connected between the follower node and the power supply node; and the capacitor-connected NFET is connected between the follower node and the ground node. In some embodiments, the tic-low circuit includes: a first ground node configured to receive the ground voltage; a first N-channel field effect transistor (NFET) having a first drain coupled to the follower node, a first source coupled to the ground node, and a first gate that is responsive to the first power supply voltage such that the first NFET is configured to: turn off so that the follower node is set to float in response to the first power supply voltage being off; and turn on so that the follower node is set at the ground voltage in response to the first power supply voltage being on. In some embodiments, the first gate is connected to receive the first power supply voltage. In some embodiments, the tic-low circuit further includes: a first power supply node configured to receive the first power supply voltage; a second ground node configured to receive the ground voltage; a first PFET having a second source, a second drain, and a second gate; and a second NFET having a third source, a third drain, and a third gate; wherein: the second source is connected to the first power supply node; the second drain is connected to the first gate; the second gate is connected to the third drain; the third gate is connected to the first gate; and the third source is connected to the second ground node. In some embodiments, the tie-low circuit further includes a second power supply node configured to receive the first power supply voltage, a second PFET having a fourth source, a fourth drain, and a fourth gate; the fourth source is connected to the second power supply node; the fourth drain is connected to the first gate; and the fourth gate is connected to the first gate. In some embodiments, the tie-low circuit further includes a third ground node configured to receive the ground voltage, and a third NFET having a fourth source, a fourth drain, and a fourth gate; the fourth source is connected to the third ground node; the fourth drain is connected to the second gate and to the third drain; and the fourth gate is connected to the fourth drain.

In some embodiments, a method of protecting a circuit from parasitic noise the method includes receiving a first power supply voltage at a follower circuit, the follower circuit being coupled to a follower node, the first power supply voltage being configured to be in a first state or a second state; receiving a second power supply voltage at control node of a tic-low circuit coupled between the follower node and a first reference node having a ground voltage, the second power supply voltage being configured to be in a first state or a second state; when the second power supply voltage is in the first state, controlling the tic-low circuit to pull a voltage level at the follower node toward the ground voltage; when the second power supply voltage is in the second state, controlling the tie-low circuit to not pull the voltage level at the follower node toward the ground voltage; and for an anti-noise circuit coupled between the follower node and at least a second reference node having the second power supply voltage, when the second power supply voltage is in the second state, using the anti-noise circuit to protect the voltage level at the follower node from being distorted by a parasitic noise voltage which otherwise is capacitively to the follower node, the parasitic noise voltage being based on a parasitic capacitive coupling of the first power supply voltage to the follower node.

In some embodiments, the anti-noise circuit includes a diode-connected field effect transistor (FET) connected between the second reference node and the follower node; and the using the anti-noise circuit to protect includes: when the second power supply voltage is in the first state, reverse-biasing the diode-connected FET; and when the second power supply voltage is in the second state, forward biasing the diode-connected FET so as to discharge the follower node through the second reference node. In some embodiments, the diode-connected FET includes a P-channel FET (PFET), the PFET having a first drain/source, a second drain/source, and a gate; each of the first drain/source and the gate is connected to the second reference node; and the second drain/source is connected to the follower node. In some embodiments, the anti-noise circuit includes a capacitor-connected P-channel field effect transistor (PCAP) coupled between the second reference node and the follower node; and the using the anti-noise circuit to protect includes: when the second power supply voltage is in the first state, using the parasitic noise voltage at the follower node to charge the PCAP thereby reducing a contribution of the parasitic noise voltage to the voltage level at the follower node. In some embodiments, the anti-noise circuit further includes a capacitor-connected N-channel field effect transistor (NCAP) coupled between the follower node and the first reference node; and the using the anti-noise circuit to protect further includes: when the second power supply voltage is in the first state, using the parasitic noise voltage at the follower node to charge the NCAP thereby further reducing the contribution of the parasitic noise voltage to the voltage level at the follower node.

In some embodiments, a method of fabricating a semiconductor device, the method including: forming one or more active regions in a semiconductor substrate; forming one or more gate electrodes over the one or more active regions so that field effect transistors (FETs) are formed correspondingly with the one or more active regions, the FETs including: one or more first FETs designated for a tie-low circuit; and one or more second FETs designated for an anti-noise circuit; forming conductors and vias that connect the FETs such that: the one or more first FETs are connected to represent the tie-low circuit; the one or more second FETs are connected to represent the anti-noise circuit; the tie-low circuit is connected to a follower node and is configured to receive a ground voltage and a first power supply voltage; the first power supply voltage is configured to exhibit at least a first state and a second state; the tie-low circuit is configured to pull a follower voltage toward the ground voltage in response to the first power supply voltage being in the first state and to not pull the follower voltage towards the ground voltage in response to the first power supply voltage being in the second state; and the anti-noise circuit is connected to the follower node, the anti-noise circuit is configured to protect the follower voltage at the follower node from otherwise being distorted by a noise voltage when the first power supply voltage is the second state. In some embodiments, the one or more second FETs include a diode-connected FET connected to the follower node. In some embodiments, the one or more second FETs include: a capacitor-connected P-channel FET that is connected to the follower node; and a capacitor-connected N-channel FET that is connected to the follower node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit to shape a follower voltage for a follower circuit, the circuit comprising:
    a tie-low circuit connected between a follower node and a ground voltage, the tie-low circuit being responsive to a second reference voltage, the follower node being connectable to the follower circuit; and
    an anti-noise circuit connected between the follower node and the second reference voltage, the anti-noise circuit being configured to protect the follower voltage at the follower node from otherwise being distorted by a noise voltage being coupled capacitively to the follower node, wherein:
    the second reference voltage is a first power supply voltage that operates in a first state and in a second state; and
    the tie-low circuit is configured to:
        pull the follower node down toward the ground voltage in response to a level of the first power supply voltage exceeding a threshold level of the tie-low circuit when the first power supply voltage is in the first state; and
        substantially not pull the follower node down toward the ground voltage in response to the level of the first power supply voltage falling below the threshold level of the tie-low circuit when the first power supply voltage is in the second state.

2. The circuit of claim 1, wherein:
    the noise voltage coupled capacitively to the follower node includes a parasitic voltage resulting from a second power supply voltage in a power domain of the follow circuit; and
    the anti-noise circuit being further configured to protect the follower node by at least one of either: 1) discharging the parasitic voltage at the follower node, or 2) offsetting the parasitic voltage at the follower node.

3. The circuit of claim 1, wherein the anti-noise circuit includes:
    a power supply node configured to receive the first power supply voltage; and
    a diode-connected field effect transistor (FET) connected between the power supply node and the follower node such that the diode-connected FET is forward biased so as to discharge the follower node through the power supply node when the level of the first power supply voltage is less than a level of a parasitic voltage included in the noise voltage.

4. The circuit of claim 3, wherein:
    the diode-connected FET is a P-channel FET (PFET), the PFET having a first drain/source terminal, a second drain/source terminal, and a gate terminal;
    the first drain/source terminal is connected to the power supply node;
    the gate terminal is connected to the first drain/source terminal; and
    the second drain/source terminal is connected to the follower node.

5. The circuit of claim 1, wherein:
    the anti-noise circuit includes:
        a capacitor-connected P-channel field effect transistor (PFET) connected to the follower node; and
        a capacitor-connected N-channel field effect transistor (NFET) connected to the follower node; and
    the capacitor-connected PFET and the capacitor-connected NFET are configured to offset the noise voltage at the follower node.

6. The circuit of claim 5, wherein:
    the anti-noise circuit further includes:
        a power supply node configured to receive the first power supply voltage; and
        a ground node configured to receive the ground voltage;
    the capacitor-connected PFET is connected between the follower node and the power supply node; and
    the capacitor-connected NFET is connected between the follower node and the ground node.

7. The circuit of claim 1, wherein the tie-low circuit comprises:
    a first ground node configured to receive the ground voltage;
    a first N-channel field effect transistor (NFET) having a first drain coupled to the follower node, a first source coupled to the first ground node, and a first gate that is responsive to the first power supply voltage such that the first NFET is configured to:
        turn off so that the follower node is set to float in response to the first power supply voltage in the second state; and
        turn on so that the follower node is set at the ground voltage in response to the first power supply voltage in the first state.

8. The circuit of claim 7, wherein the first gate is connected to receive the first power supply voltage.

9. The circuit of claim 7, wherein the tie-low circuit further comprises:
    a first power supply node configured to receive the first power supply voltage;
    a second ground node configured to receive the ground voltage;
    a first PFET having a second source, a second drain, and a second gate; and
    a second NFET having a third source, a third drain, and a third gate;
    wherein:
        the second source is connected to the first power supply node;
        the second drain is connected to the first gate;
        the second gate is connected to the third drain;
        the third gate is connected to the first gate; and
        the third source is connected to the second ground node.

10. The circuit of claim 9, wherein:
the tie-low circuit further includes:
a second power supply node configured to receive the first power supply voltage; and
a second PFET having a fourth source, a fourth drain, and a fourth gate
the fourth source is connected to the second power supply node;
the fourth drain is connected to the first gate; and
the fourth gate is connected to the first gate.

11. The circuit of claim 9, wherein:
the tie-low circuit further includes:
a third ground node configured to receive the ground voltage; and
a third NFET having a fourth source, a fourth drain, and a fourth gate;
the fourth source is connected to the third ground node;
the fourth drain is connected to the second gate and to the third drain; and
the fourth gate is connected to the fourth drain.

12. The circuit of claim 1, wherein:
the tie-low circuit includes an N-channel field effect transistor having a drain coupled to the follower node, a source coupled to the ground voltage, and a gate coupled to the first power supply voltage, and
the anti-noise circuit includes a diode-connected P-channel field effect transistor coupled between the first power supply voltage and the drain of the N-channel field effect transistor.

13. A method of protecting a circuit from parasitic noise the method comprising:
receiving a first power supply voltage at a follower circuit, the follower circuit being coupled to a follower node, the first power supply voltage being configured to be in a first state or a second state;
receiving a second power supply voltage at control node of a tie-low circuit coupled between the follower node and a first reference node having a ground voltage, the second power supply voltage being configured to be in a first state or a second state;
when the second power supply voltage is in the first state, controlling the tie-low circuit to pull a voltage level at the follower node toward the ground voltage;
when the second power supply voltage is in the second state, controlling the tie-low circuit to not pull the voltage level at the follower node toward the ground voltage; and
for an anti-noise circuit coupled between the follower node and at least a second reference node having the second power supply voltage, when the second power supply voltage is in the second state, using the anti-noise circuit to protect the voltage level at the follower node from being distorted by a parasitic noise voltage which otherwise is capacitively to the follower node, the parasitic noise voltage being based on a parasitic capacitive coupling of the first power supply voltage to the follower node.

14. The method of claim 13, wherein:
the anti-noise circuit includes a diode-connected field effect transistor (FET) connected between the second reference node and the follower node; and
the using the anti-noise circuit to protect includes:
when the second power supply voltage is in the first state, reverse-biasing the diode-connected FET; and
when the second power supply voltage is in the second state, forward biasing the diode-connected FET so as to discharge the follower node through the second reference node.

15. The method of claim 14, wherein:
the diode-connected FET includes a P-channel FET (PFET), the PFET having a first drain/source, a second drain/source, and a gate;
each of the first drain/source and the gate is connected to the second reference node; and
the second drain/source is connected to the follower node.

16. The method of claim 13, wherein:
the anti-noise circuit includes a capacitor-connected P-channel field effect transistor (PCAP) coupled between the second reference node and the follower node; and
the using the anti-noise circuit to protect includes:
when the second power supply voltage is in the first state, using the parasitic noise voltage at the follower node to charge the PCAP thereby reducing a contribution of the parasitic noise voltage to the voltage level at the follower node.

17. The method of claim 16, wherein:
the anti-noise circuit further includes a capacitor-connected N-channel field effect transistor (NCAP) coupled between the follower node and the first reference node; and
the using the anti-noise circuit to protect further includes:
when the second power supply voltage is in the first state, using the parasitic noise voltage at the follower node to charge the NCAP thereby further reducing the contribution of the parasitic noise voltage to the voltage level at the follower node.

18. A method of fabricating a semiconductor device, the method comprising:
forming one or more active regions in a semiconductor substrate;
forming gate electrodes over the one or more active regions so that one or more first field effect transistors (FETs) and one or more second FETs are formed; and
forming conductors and vias such that:
the one or more first FETs are connected in a tie-low circuit;
the one or more second FETs are connected in an anti-noise circuit;
the tie-low circuit is connected to a follower node and is configured to receive a ground voltage and a first power supply voltage;
the first power supply voltage is configured to exhibit at least a first state and a second state;
the tie-low circuit is configured to pull a follower voltage toward the ground voltage in response to the first power supply voltage being in the first state and to not pull the follower voltage towards the ground voltage in response to the first power supply voltage being in the second state; and
the anti-noise circuit is connected to the follower node, the anti-noise circuit is configured to protect the follower voltage at the follower node from otherwise being distorted by a noise voltage when the first power supply voltage is the second state.

19. The method of claim 18, wherein the one or more second FETs include a diode-connected FET connected to the follower node.

20. The method of claim 18, wherein the one or more second FETs include:
- a capacitor-connected P-channel FET that is connected to the follower node; and
- a capacitor-connected N-channel FET that is connected to the follower node.

* * * * *